(12) United States Patent
Morita

(10) Patent No.: US 11,994,550 B2
(45) Date of Patent: May 28, 2024

(54) TEMPERATURE TEST APPARATUS AND TEMPERATURE TEST METHOD

(71) Applicant: ANRITSU CORPORATION, Kanagawa (JP)

(72) Inventor: Tomonori Morita, Kanagawa (JP)

(73) Assignee: ANRITSU CORPORATION, Kanagawa (JP)

( * ) Notice: Subject to any disclaimer, the term of this patent is extended or adjusted under 35 U.S.C. 154(b) by 430 days.

(21) Appl. No.: 17/533,710

(22) Filed: Nov. 23, 2021

(65) Prior Publication Data

US 2022/0252653 A1 Aug. 11, 2022

(30) Foreign Application Priority Data

Feb. 5, 2021 (JP) ................... 2021-017546

(51) Int. Cl.
*G01R 31/10* (2006.01)
*G01R 29/08* (2006.01)
*G01R 29/10* (2006.01)
*G01R 31/28* (2006.01)

(52) U.S. Cl.
CPC ....... *G01R 29/105* (2013.01); *G01R 29/0864* (2013.01); *G01R 31/2874* (2013.01); *G01R 29/0878* (2013.01)

(58) Field of Classification Search
CPC ............ G01R 29/0864; G01R 29/0821; G01R 29/0871; G01R 29/0878; G01R 29/10; G01R 29/105; G01R 31/001; G01R 31/003; G01R 31/302; G01R 31/2851; G01R 31/2834; G01R 31/2874; H05K 9/0015; H05K 9/0041; H05K 9/69; H01R 24/54; H01R 24/56
See application file for complete search history.

(56) References Cited

U.S. PATENT DOCUMENTS

| 2013/0175082 A1* | 7/2013 | Kim ..................... H05K 9/0041 |
| | | 174/383 |
| 2017/0016944 A1* | 1/2017 | Esplin .................. G01R 29/105 |
| 2019/0101580 A1* | 4/2019 | Huang ..................... H04B 1/16 |
| 2019/0212386 A1* | 7/2019 | Rowell ............. G01R 31/2874 |
| 2020/0025822 A1 | 1/2020 | Rowell et al. |
| 2021/0055337 A1 | 2/2021 | Kobayashi et al. |
| 2021/0293869 A1 | 9/2021 | Kobayashi et al. |

FOREIGN PATENT DOCUMENTS

| JP | 2021-032682 A | 3/2021 |
| JP | 2021-148631 A | 9/2021 |

* cited by examiner

*Primary Examiner* — Thang X Le

(74) *Attorney, Agent, or Firm* — Pearne & Gordon LLP

(57) ABSTRACT

The temperature test apparatus includes an OTA chamber 50 as an anechoic box, a heat insulating housing that is accommodated in the OTA chamber, a temperature control device that controls a temperature in the heat insulating housing, a ventilation block 210 that is made of metal and provided to block an opening 502 formed in the OTA chamber, and in which a plurality of through-holes 214 are formed, a first cover 220 that is provided on an outer side of the OTA chamber to cover the ventilation block, and form a first space 225 with the ventilation block, and is joined to a pipe for air from the temperature control device, and a second cover 250 that is provided on an inner side of the OTA chamber to cover the ventilation block, and form a second space 255 communicating with the heat insulating housing, together with the ventilation block.

20 Claims, 20 Drawing Sheets

TEMPERATURE TEST APPARATUS AND TEMPERATURE TEST METHOD

TECHNICAL FIELD

The present invention relates to a temperature test apparatus and a temperature test method.

BACKGROUND ART

In recent years, with the development of multimedia, radio terminals (smartphones and the like) equipped with antennas for radio communication such as cellular and wireless local area network (LAN) have been actively produced. In the future, in particular, there is a demand for radio terminals that transmit and receive radio signals compatible with IEEE 802.11ad, 5G cellular, and the like, which use wideband signals in the millimeter wave band.

In a design and development company or manufacturing plant of a radio terminal, a performance test as follows is performed on a radio communication antenna of the radio terminal: an output level of a transmission radio wave defined for each communication standard or reception sensitivity is measured, and it is determined whether or not to satisfy a predetermined criterion.

With the transition of generations from 4G or 4G advanced to 5G, a test method of the above-described performance test also changes. For example, in a performance test in which a radio terminal for a 5G New Radio (NR) system is set as a device under test (DUT), the test is performed in an OTA (Over The Air) environment. In the OTA test, a DUT and a test antenna are accommodated in an anechoic box that is not influenced by the surrounding radio wave environment, and signals are transmitted and received between the test antenna and the DUT by radio communication. Specifically, in the anechoic box, the transmission of a test signal from the test antenna to the DUT and the reception of a measurement target signal from the DUT that receives the test signal by the test antenna are performed by radio communication (for example, see Patent Document 1).

In the performance test under the OTA environment, a temperature test in which the temperature around a DUT is shaken to a high temperature (for example, 55° C.) and a low temperature (for example, -10° C.) is required in addition to a test at room temperature. In the temperature test, in a state where a DUT is disposed in a heat insulating housing, temperature-controlled air is sent to the heat insulating housing to control the temperature in the heat insulating housing (for example, see Patent Documents 2 and 3).

RELATED ART DOCUMENT

Patent Document

[Patent Document 1] Japanese Patent Application No. 2019-152723
[Patent Document 2] US 2020/0025822
[Patent Document 3] Japanese Patent Application No. 2020-049302

DISCLOSURE OF THE INVENTION

Problem that the Invention is to Solve

In a test apparatus disclosed in Patent Document 2, the air having a temperature controlled by a temperature control device (air conditioner) is supplied to the heat insulating housing from the temperature control device through a pipe, and thus the temperature in the heat insulating housing is controlled. However, the test apparatus disclosed in Patent Document 2 does not consider any technique for suppressing leakage of a radio wave from the pipe through which the temperature-controlled air passes, or leakage of a radio wave from an opening formed in an outer surface plate of an anechoic box in order to dispose the pipe up to the heat insulating housing.

To solve such a problem, in the test apparatus disclosed in Patent Document 3, in order to suppress the leakage of a radio wave from a pipe through which the temperature-controlled air passes, a pipe made of metal is disposed up to the heat insulating housing from the opening formed in the outer surface plate of the anechoic box, and a metal mesh is provided at an end portion or an intermediate portion of the pipe. Such a configuration is quite effective in preventing the leakage of a radio wave from the anechoic box, but a configuration with more effectiveness and high assemblability is desired.

The present invention has been made to solve such a problem in the related art, and an object of the present invention is to provide a temperature test apparatus and a temperature test method having a high electromagnetic shielding property of an anechoic box and high assemblability.

Means for Solving the Problem

In order to solve the above problems, according to the present invention, a temperature test apparatus includes an anechoic box 50, a heat insulating housing 70 that is accommodated in the anechoic box, a temperature control device 120 that controls a temperature in the heat insulating housing, a ventilation block 210 that is made of metal and provided to block an opening 502 formed in an outer surface plate 501 of the anechoic box, and in which a plurality of through-holes 214 that penetrate from one end surface 215 to the other end surface 216 are formed, a first cover 220 that is provided on an outer side of the anechoic box to cover the one end surface of the ventilation block, and form a first space 225 with the ventilation block, and includes a first communication hole 223 for causing the first space to communicate with an outside of the anechoic box or an external pipe, and a second cover 250 that is provided on an inner side of the anechoic box to cover the other end surface of the ventilation block, and form a second space 255 with the ventilation block, and includes a second communication hole 253 for causing the second space to communicate with an inside of the heat insulating housing or an internal pipe. The through-hole of the ventilation block has a size that causes a gas having a temperature controlled by the temperature control device or a gas in the heat insulating housing to pass through and causes at least a test radio wave used in the anechoic box not to pass through.

As described above, the ventilation block is provided to block the opening formed in the outer surface plate of the anechoic box. The plurality of through-holes that penetrate from one end surface to the other end surface have a size of causing a gas having a temperature controlled by the temperature control device or a gas in the heat insulating housing to pass through, and causes at least a test radio wave used in the anechoic box not to pass through. With this configuration, the opening formed in the outer surface plate of the anechoic box is electromagnetically shielded by the ventilation block, it is not possible to emit the radio wave in the anechoic box to the outside through the opening, and it is not possible to causing an external unnecessary radio wave to enter into the anechoic box through the opening.

For example, when the ventilation block, the first cover, and the second cover are used for an intake passage, the gas having a temperature controlled by the temperature control device enters into the first space from the first communication hole of the first cover, enters into the second space of the second cover from the through-hole of the ventilation block, and then is sent to the heat insulating housing from the second communication hole. Thus, it is possible to supply the gas having a temperature controlled by the temperature control device to the heat insulating housing while functioning as an electromagnetic shield at the opening of the anechoic box.

For example, when the ventilation block, the first cover, and the second cover are used for an exhaust passage, the gas in the heat insulating housing enters into the second space from the second communication hole of the second cover, enters into the first space of the first cover from the through-hole of the ventilation block, and then is discharged to the outside of the anechoic box from the first communication hole. Thus, it is possible to discharge the gas in the heat insulating housing to the outside of the anechoic box while functioning as an electromagnetic shield at the opening of the anechoic box.

The first space and the second space are formed in the front and rear of the ventilation block. With this configuration, resistance against the flow of the gas increases by the ventilation block, but the first space and the second space facilitate the flow of the gas, Thus, it is possible to suppress a decrease in the flow rate of the gas as a whole.

In addition, the ventilation block can be attached to the outer surface plate of the anechoic box, and the first cover and the second cover can also be attached to the outer surface plate of the anechoic box or the ventilation block. Thus, it is not necessary to draw the pipe and an assembly work is easily performed.

Further, in the temperature test apparatus according to the present invention, an end surface 256 in which the second communication hole of the second cover is formed may be configured to be attached to an outer surface 70*a* of the heat insulating housing so that the second communication hole corresponds to an intake port 170 or an exhaust port 171 of the heat insulating housing.

With this configuration, the second cover may just be attached to the outer surface of the heat insulating housing, and it is not necessary to dispose an intake or exhaust pipe to be drawn. Thus, the assembly work is easily performed.

Further, in the temperature test apparatus according to the present invention, the through-hole of the ventilation block may be configured to have a curved portion 217 between the one end surface and the other end surface.

With this configuration, in the temperature test apparatus according to the present invention, traveling of a radio wave that has strong straightness and has a short wavelength is blocked at the curved portion of the through-hole. The radio wave is leaked to the outside less frequently, and intrusion from the outside occurs less frequently.

Further, in the temperature test apparatus according to the present invention, a pipe fitting 181 for connecting a pipe for supplying a temperature-controlled gas from the temperature control device may be configured to be attached to the first communication hole of the first cover.

With this configuration, in the temperature test apparatus according to the present invention, it is possible to easily connect a pipe for transferring a gas having a temperature controlled by the temperature control device.

Further, in the temperature test apparatus according to the present invention, an exhaust fan for forcibly discharging the gas in the heat insulating housing to the outside may be configured to be attached to the first communication hole of the first cover.

With this configuration, in the temperature test apparatus according to the present invention, it is possible to suppresses the leakage of the gas in the heat insulating housing from a gap of the assembled heat insulating housing into the anechoic box, and to forcibly discharge the gas in the heat insulating housing to the outside of the anechoic box.

Further, in the temperature test apparatus according to the present invention, the second communication hole of the second cover may be configured to have the same size as the exhaust port formed to be smaller than the intake port of the heat insulating housing.

With this configuration, in the temperature test apparatus according to the present invention, it is possible to increase a time during which the gas having a temperature controlled by the temperature control device stays in the heat insulating housing, and to efficiently make the temperature in the heat insulating housing uniform.

Further, in the temperature test apparatus according to the present invention, the first cover may be configured to include a cover body 221 that forms the first space, and an attachment plate 230 that extends around an end portion of the cover body in a brim shape. The attachment plate may be configured to have a groove for a heater wiring, the groove being formed on a surface on an opposite side of a surface of the attachment plate on a side on which the cover body is located, and be attached to the outer surface plate from the outer side so that the surface on the opposite side faces the outer surface plate of the anechoic box. The attachment plate may be configured to accommodate a heater 240 in the groove for the heater wiring.

With this configuration, in the temperature test apparatus according to the present invention, it is possible to effectively prevent dew condensation occurring near the opening at which the anechoic box and the pipe from the temperature control device are connected to each other. For example, even when the temperature in the heat insulating housing is controlled to −10° C., it is possible to prevent an occurrence of dew condensation on the back surface of the anechoic box. Thus, it is also possible to prevent an occurrence of rust in a mechanical section provided on the back surface of the anechoic box.

Further, the temperature test apparatus according to the present invention may be configured to further include a test antenna 6 that is provided in the anechoic box, and transmits or receives a radio signal to or from a device under test, a posture changeable mechanism 60 that is provided in the anechoic box and controls a posture of the device under test, and a measurement device 2 that measures transmission characteristics or reception characteristics of the device under test by using the test antenna each time the posture of the device under test is changed by the posture changeable mechanism in a state where the temperature in the heat insulating housing is controlled by the temperature control device.

With this configuration, in the temperature test apparatus according to the present invention, it is possible to measure temperature dependency and posture dependency of the transmission characteristics or the reception characteristics of the device under test.

According to the present invention, there is provided a temperature test method using the temperature test apparatus described in any of the above-described aspects. The temperature test method includes a temperature control step S2 of controlling a temperature of the heat insulating housing to a plurality of predetermined temperatures, a posture changeable step S4 of sequentially changing a posture of a device under test disposed in the heat insulating housing, and a measurement step S7 of measuring transmission characteristics or reception characteristics of the device under test by changing the posture of the device under test in the posture changeable step, in a state where the temperature of the heat insulating housing is controlled by the temperature control step.

As described above, in the temperature test apparatus used in the temperature test method according to the present invention, the ventilation block is provided to block the opening formed in the outer surface plate of the anechoic box. The plurality of through-holes that penetrate from the one end surface to the other end surface have a size of causing the gas having a temperature controlled by the temperature control device or the gas in the heat insulating housing to pass through, and causing at least the test radio wave used in the anechoic box not to pass through. With this configuration, even though the measurement step of measuring the transmission characteristics or the reception characteristics of the device under test is performed each time the posture of the device under test is changed by the posture changeable step in a state where the temperature in the heat insulating housing is controlled by the temperature control step, the opening formed in the outer surface plate of the anechoic box is electromagnetically shielded by the ventilation block. It is not possible to emit the radio wave in the anechoic box to the outside through the opening, and it is not possible to enter an external unnecessary radio wave into the anechoic box through the opening. Thus, in the temperature test method, it is possible to intake air to the heat insulating housing or exhaust air from the heat insulating housing while electromagnetically shielding the opening of the anechoic box.

Advantage of the Invention

According to the present invention, it is possible to provide a temperature test apparatus and a temperature test method having a high electromagnetic shielding property of an anechoic box and high assemblability.

BEST MODE FOR CARRYING OUT THE INVENTION

Hereinafter, a temperature test apparatus and a temperature test method according to an embodiment of the present invention will be described with reference to the drawings.

Figure 1:
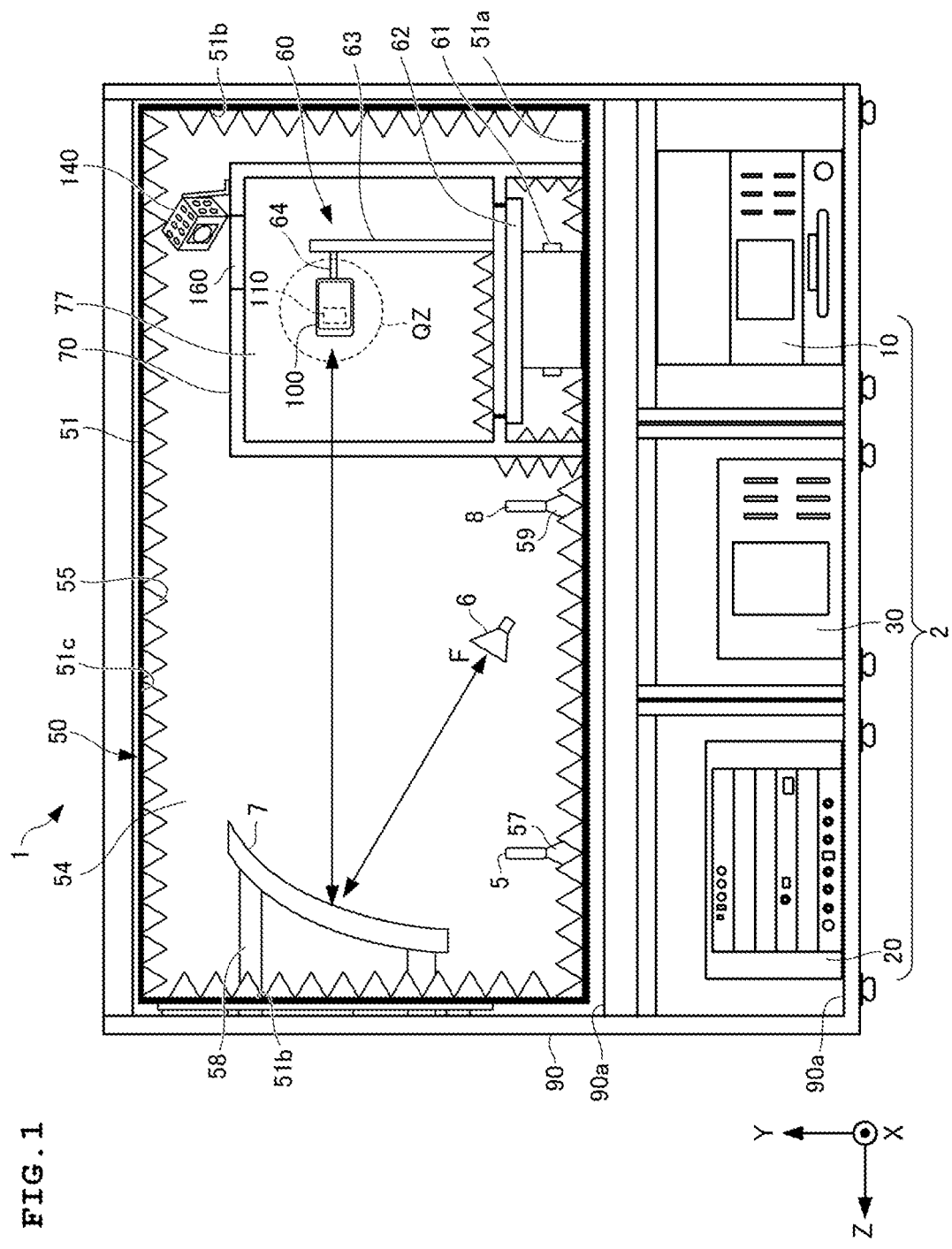
FIG. 1 is a diagram illustrating a schematic configuration of a temperature test apparatus according to an embodiment of the present invention.

A temperature test apparatus 1 according to the embodiment measures the temperature dependency of transmission characteristics or reception characteristics of a DUT 100 including an antenna 110 under an OTA environment. Therefore, as illustrated in FIG. 1, the temperature test apparatus 1 includes an OTA chamber 50, a test antenna 6, a posture changeable mechanism 60, a heat insulating housing 70, a temperature control device 120, and a measurement device 2. In the embodiment, the OTA chamber 50 corresponds to an anechoic box of the present invention. The components will be described below.

OTA Chamber

The OTA chamber 50 realizes an OTA test environment for performing a performance test of a radio terminal for 5G, for example. The OTA chamber 50 has an internal space 54 that is not influenced by the surrounding radio wave environment. Specifically, as illustrated in FIG. 1, the OTA chamber 50 is configured by, for example, a rectangular parallelepiped chamber body 51 made of metal, and has the rectangular parallelepiped internal space 54 in the chamber body 51. A DUT 100 and a test antenna 6 are accommodated in the internal space 54 of the OTA chamber 50 in a state of preventing the intrusion of a radio wave from the outside and the radiation of radio waves to the outside. The test antenna 6 transmits and receives a radio signal to and from an antenna 110 of the DUT 100.

A reflector 7 and a heat insulating housing 70 are accommodated in the internal space 54 of the OTA chamber 50. The reflector reflects the radio signal radiated from the test antenna 6 toward the antenna 110 of the DUT 100. The heat insulating housing is made of a heat insulating material to surround a spatial region 77 including a quiet zone QZ. A radio wave absorber 55 is attached to the entirety of the inner surface of the OTA chamber 50, that is, the entire surface of the bottom surface 51a, the side surface 51b, and the top surface 51c of the chamber body 51 which is in contact with the internal space 54. Thus, anechoic characteristics of the internal space 54 are secured, and a radiation regulation function of a radio wave to the outside is reinforced. As described above, the OTA chamber 50 realizes the anechoic box having the internal space 54 that is not influenced by the surrounding radio wave environment. The OTA chamber 50 as the anechoic box used in the present embodiment is, for example, an anechoic type.

Here, the "quiet zone" has a concept representing a range of a spatial region in which a radio wave of the DUT 100 is emitted from the test antenna 6 with a substantially uniform amplitude and phase in the OTA chamber 50 that realizes the OTA test environment. The shape of the quiet zone QZ is usually spherical. It is possible to perform the OTA test in a state where an influence of scattered waves from the surroundings is suppressed, by disposing the DUT 100 in such a quiet zone QZ.

The temperature test apparatus 1 is used, for example, together with a rack structure body 90 including a plurality of racks 90a as illustrated in FIG. 1, and is operated in a state where each component is mounted on each rack 90a. FIG. 1 illustrates an example in which an integrated control device 10, an NR system simulator 20, a radio communication analyzer 30, and the OTA chamber 50 are mounted on each rack 90a of the rack structure body 90. The temperature control device 120 is not accommodated in the rack 90a and is provided separately from the rack structure body 90.

Next, the appearance of the temperature test apparatus 1 will be described.

Figure 2A:
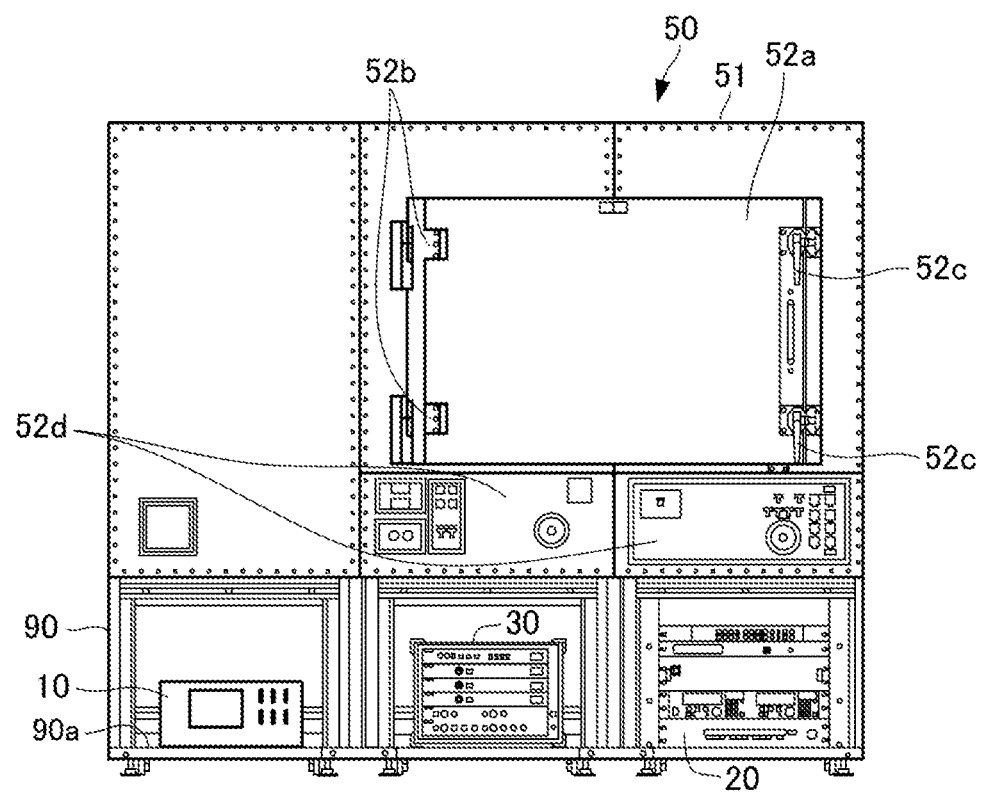
FIG. 2A is a front view of the temperature test apparatus according to the embodiment of the present invention.
Figure 2B:
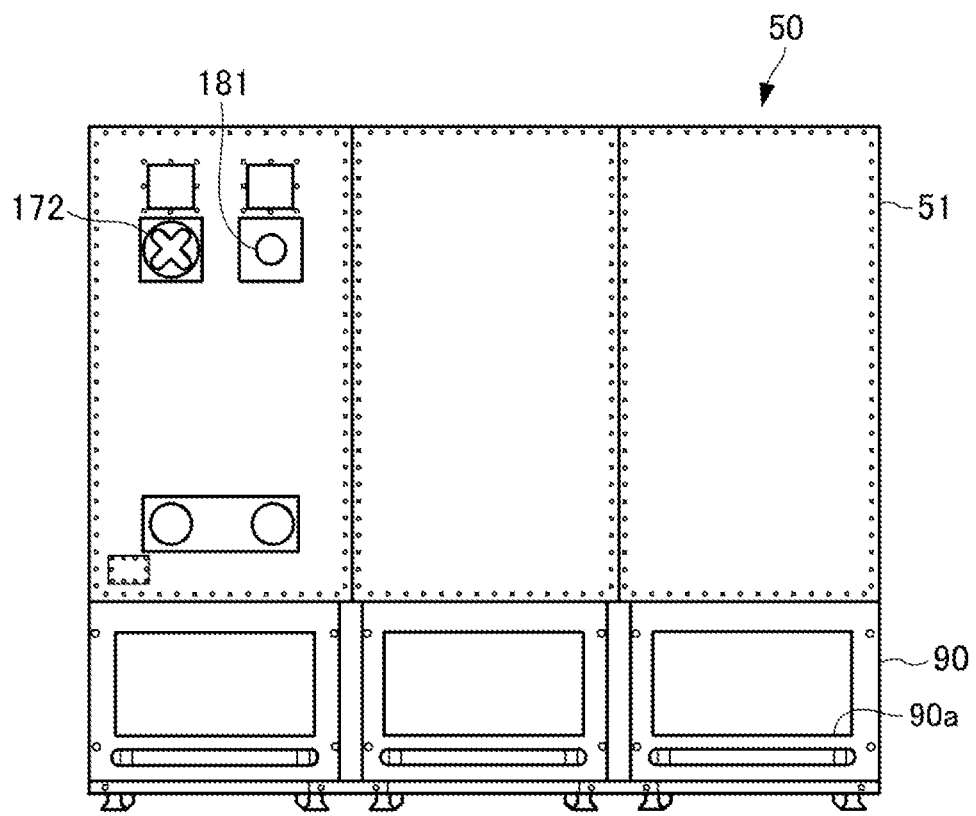
FIG. 2B is a rear view of the temperature test apparatus.

FIG. 2A is a front view of the temperature test apparatus 1 according to the present embodiment, and FIG. 2B is a rear view. As illustrated in FIG. 2A, a door 52a is provided in front of the chamber body 51. The door 52a has a rectangular planar shape and is attached to the chamber body 51 so as to be openable and closable via a hinge 52b. A user can operate a handle 52c to open the door 52a, and thus perform various operations in the OTA chamber 50, such as setting up the heat insulating housing 70 and the like in the OTA chamber 50. The door 52a has a size of allowing at least the components disposed in the OTA chamber 50, such as the heat insulating housing 70 to be put into the OTA chamber 50.

The chamber body 51 has an access panel 52d on the front surface in addition to the door 52a described above. The access panel 52d has a function of electrically connecting an internal device disposed in the internal space 54 of the chamber body 51 and an external device disposed outside the chamber body 51 to each other. Examples of the internal device connected to the access panel 52d include the test antenna 6, a drive unit 61 of the posture changeable mechanism 60, an infrared camera device 140, and the DUT 100, which will be described later. Examples of the external device connected to the access panel 52d include the integrated control device 10, the NR system simulator 20, a signal processing unit 40, and the radio communication analyzer 30.

As illustrated in FIG. 2B, the chamber body 51 is provided with a pipe fitting 181 and an exhaust fan 380 on the back surface of the chamber. The pipe fitting 181 connects the intake passage on the inner side of the OTA chamber 50 and the intake passage on the outer side of the OTA chamber 50 in the intake passage for introducing the temperature-controlled gas (air) into the heat insulating housing 70. The exhaust fan 380 is provided for forcibly exhausting the air in the heat insulating housing 70.

DUT

The DUT 100 as a device under test is, for example, a radio terminal such as a smartphone. Communication standards for the DUT 100 includes cellular (LTE, LTE-A, W-CDMA (registered trademark), GSM (registered trademark), CDMA 2000, 1xEV-DO, TD-SCDMA, and the like), wireless LAN (IEEE 802.11b/g/a/n/ac/ad, and the like), Bluetooth (registered trademark), GNSS (GPS, Galileo, GLONASS, BeiDou, and the like), FM, and digital broadcasting (DVB-H, ISDB-T, and the like). The DUT 100 may be a radio terminal that transmits and receives a radio signal of a millimeter wave band corresponding to 5G cellular or the like.

In the embodiment, as an example, description will be made on the assumption that the DUT 100 is a 5G NR radio terminal. For the 5G NR radio terminal, it is defined by the 5G NR standard, that a predetermined frequency band including a millimeter wave band and other frequency bands used in LTE and the like is set as a communicable frequency range. In short, the antenna 110 of the DUT 100 transmits or receives a radio signal of a predetermined frequency band (5G NR band), which is a measurement target for the transmission characteristics or the reception characteristics of the DUT 100. The antenna 110 is, for example, an array antenna such as a Massive-MIMO antenna, and corresponds to an antenna under test in the invention.

In the embodiment, the DUT 100 can receive a test signal and transmit a measurement target signal via the test antenna 6 during measurement related to transmission and reception in the OTA chamber 50.

Posture Changeable Mechanism

The posture changeable mechanism 60 sequentially changes the posture of the DUT 100 disposed in a quiet zone QZ in the internal space 54 of the OTA chamber 50. As illustrated in FIG. 1, the posture changeable mechanism 60 is provided on the bottom surface 51a on the internal space 54 side of the chamber body 51 of the OTA chamber 50. The posture changeable mechanism 60 is, for example, a biaxial positioner including a rotating mechanism that rotates around each of two axes. The posture changeable mechanism 60 forms an OTA test system (Combined-axes system) in which the DUT 100 is rotated with a degree of freedom of rotation around two axes in a state where the test antenna 6 is fixed. Specifically, the posture changeable mechanism 60 includes the drive unit 61, a turntable 62, a fulcrum 63, and a DUT mounting portion 64 as a device-under-test mounting portion.

The drive unit 61 is configured by a drive motor such as a stepping motor that generates a rotational driving force. The drive unit is installed on, for example, the bottom surface 51a. The turntable 62 rotates by a predetermined angle around a first axis among two axes perpendicular to each other, by the rotational driving force of the drive unit 61. The fulcrum 63 is joined to the turntable 62. The fulcrum extends from the turntable 62 in a direction of the first axis, and rotates together with the turntable 62 by the rotational driving force of the drive unit 61. The DUT mounting portion 64 extends from the side surface of the fulcrum 63 in a direction of a second axis among the two axes, and rotates by a predetermined angle around the second axis by the rotational driving force of the drive unit 61. The DUT 100 is mounted on the DUT mounting portion 64.

The above-described first axis is, for example, an axis (Y axis in FIG. 1) extending in a vertical direction to the bottom surface 51a in the drawing). The second axis is, for example, an axis extending in a horizontal direction from the side surface of the fulcrum 63. The posture changeable mechanism 60 configured as described above can rotate the DUT 100 held on the DUT mounting portion 64, so as to enable the sequential change of the posture of the DUT in a state where the antenna 110 is directed toward the test antenna 6 and the reflector 7 in all three-dimensional directions. For example, the center of the DUT 100 is set as the rotation center.

Near Field and Far Field

Next, the near field and the far field will be described.

Figure 6A:
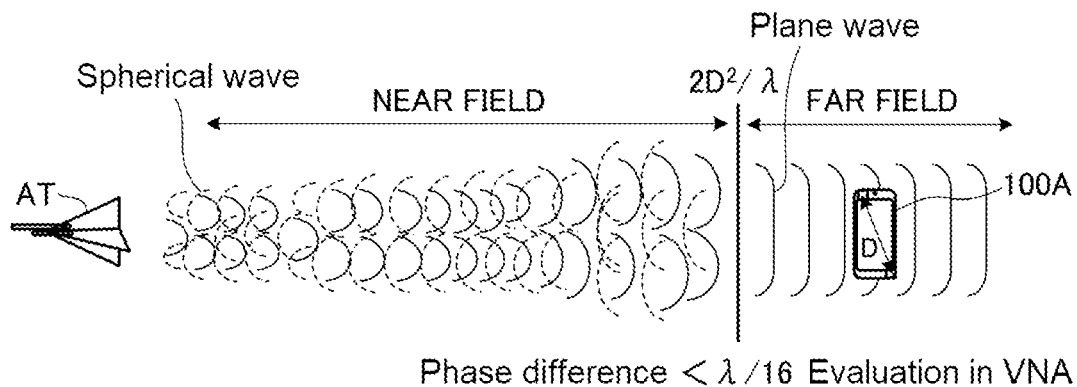
FIG. 6A is a schematic diagram illustrating a near field and a far field in radio wave propagation between an antenna and a radio terminal.
Figure 6B:
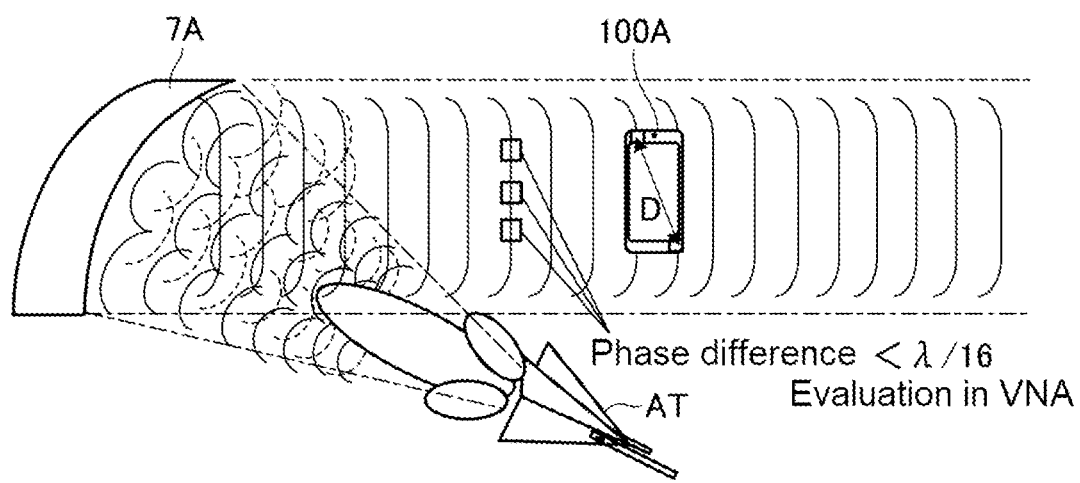
FIG. 6B is a schematic diagram illustrating a form of radio wave propagation in a case using a reflecting mirror.

FIG. 6 is a schematic diagram illustrating how radio waves radiated from an antenna AT toward a radio terminal 100A are transmitted. The antenna AT is equivalent to the test antenna 6 as a primary radiator, which will be described later. The radio terminal 100A is equivalent to the DUT 100. In FIG. 6, FIG. 6A illustrates a direct far field (DFF) method in which a radio wave is directly transmitted from the antenna AT to the radio terminal 100A, and FIG. 6B illustrates an indirect far field (IFF) method in which a radio wave is transmitted from the antenna AT to the radio terminal 100A through a reflecting mirror 7A having a rotating paraboloid.

As illustrated in FIG. 6A, a radio wave having a radiation source being the antenna AT has a property of propagating while a surface (wave surface) joining points having the same phase spreads spherically around the radiation source. At this time, interference waves generated due to disturbances such as scattering, refraction, and reflection as indicated by broken lines are also generated. The wave surface is a curved spherical surface (spherical wave) at a distance close to the radiation source, but the wave surface becomes close to a plane (plane wave) at a distance far from the radiation source. In general, a region where the wave surface is required to be considered as a spherical surface is referred to as a near field, and a region where the wave surface may not be considered as a plane is referred to as a far field. In the propagation of radio waves illustrated in FIG. 6A, it is preferable that the radio terminal 100A receives a plane wave rather than a spherical wave in order to perform accurate measurement.

In order to receive a plane wave, the radio terminal 100A needs to be installed in a far field. When the position and antenna size of the antenna 110 in the DUT 100 are not known, the far field is a region beyond $2D^2/\lambda$, from the antenna AT. Here, D indicates the maximum linear size of the radio terminal 100A, and $\lambda$, indicates the wavelength of the radio wave.

FIG. 6B illustrates a method (compact antenna test range (CATR) method) of disposing the reflecting mirror 7A having a rotating paraboloid so that a radio wave of the antenna AT is reflected, and then the reflected wave reaches the position of the radio terminal 100A. According to such a method, it is possible to reduce the distance between the antenna AT and the radio terminal 100A, and the region of the plane wave expands from the distance immediately after the reflection on the mirror surface of the reflecting mirror 7A. Thus, it is possible to expect an effect of reducing the propagation loss. The degree of the plane wave can be expressed by the phase difference between waves of the same phase. The phase difference that is permissible as the degree of the plane wave is, for example, $\lambda/16$. The phase difference can be evaluated, for example, with a vector network analyzer (VNA).

Test Antenna

Next, the test antenna 6 will be described.

Figure 3:
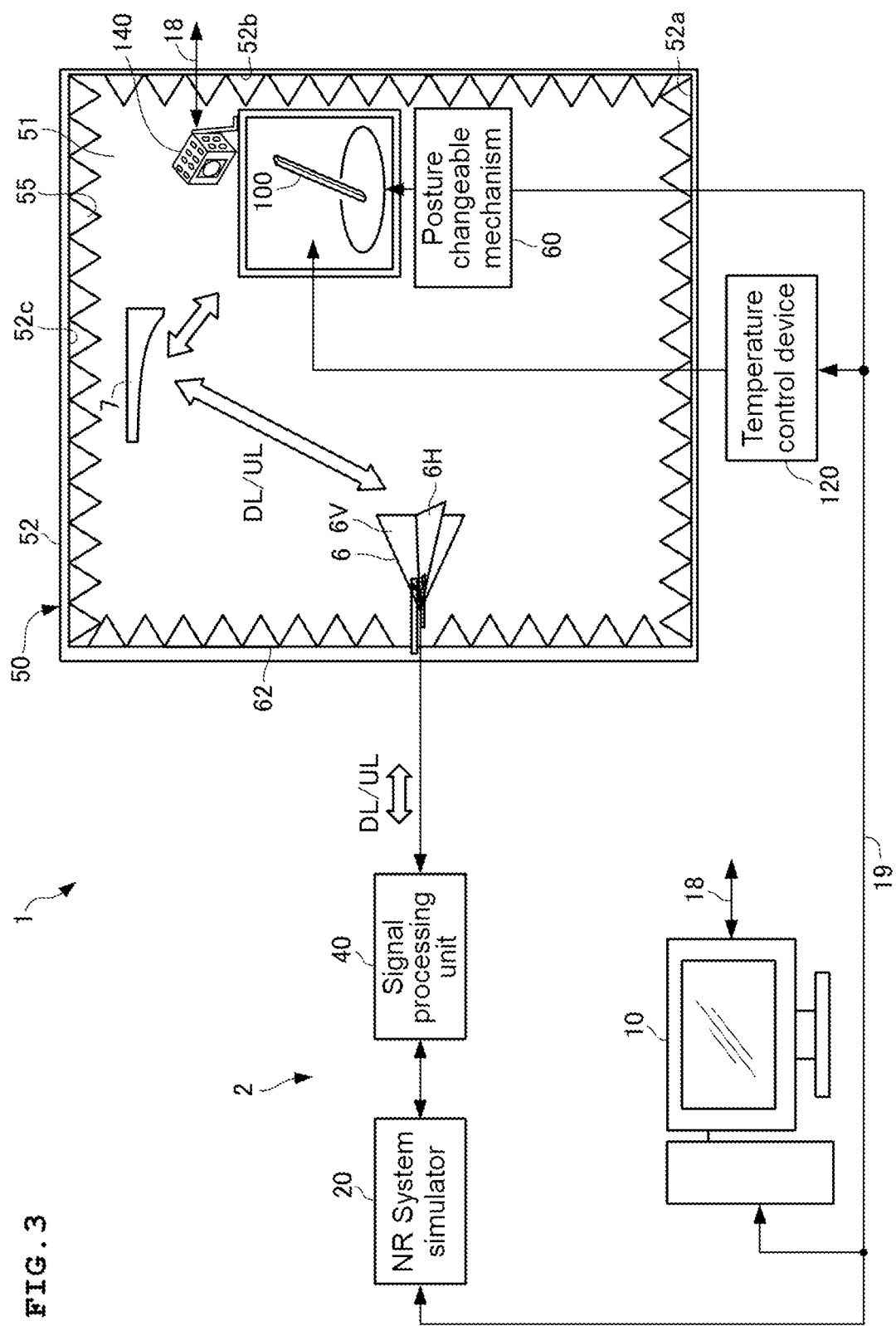
FIG. 3 is a block diagram illustrating a functional configuration of the temperature test apparatus according to the embodiment of the present invention.

The test antenna 6 is accommodated in the internal space 54 of the OTA chamber 50, and transmits or receives a radio signal for measuring the transmission characteristics or the reception characteristics of the DUT 100, to and from the antenna 110 via the reflector 7. The test antenna 6 includes a horizontally polarized antenna 6H and a vertically polarized antenna 6V (see FIG. 3). As the test antenna 6, for example, an antenna for millimeter waves, that has directivity, such as a horn antenna can be used. The reflector 7 has an offset parabolic (see FIG. 7) type structure described later. As illustrated in FIG. 1, the reflector 7 is attached to the required position of the OTA chamber 50 on the side surface 51b by using a reflector holder 58.

The reflector 7 receives a radio wave of a test signal radiated from the test antenna 6 as the primary radiator disposed at the focal position F defined from the rotating paraboloid, on the rotating paraboloid. Then, the reflector reflects the radio wave toward the DUT 100 held by the posture changeable mechanism 60 (during transmission). The reflector 7 receives the radio wave of a measurement target signal radiated from the antenna 110 by the DUT 100 that has received the test signal, on the rotating paraboloid. Then, the reflector reflects the test signal toward the test antenna 6 that has radiated the test signal (during reception). That is, the reflector 7 is configured to reflect the radio wave of the radio signal transmitted and received between the test antenna 6 and the antenna 110 through the rotating paraboloid.

Figure 7:
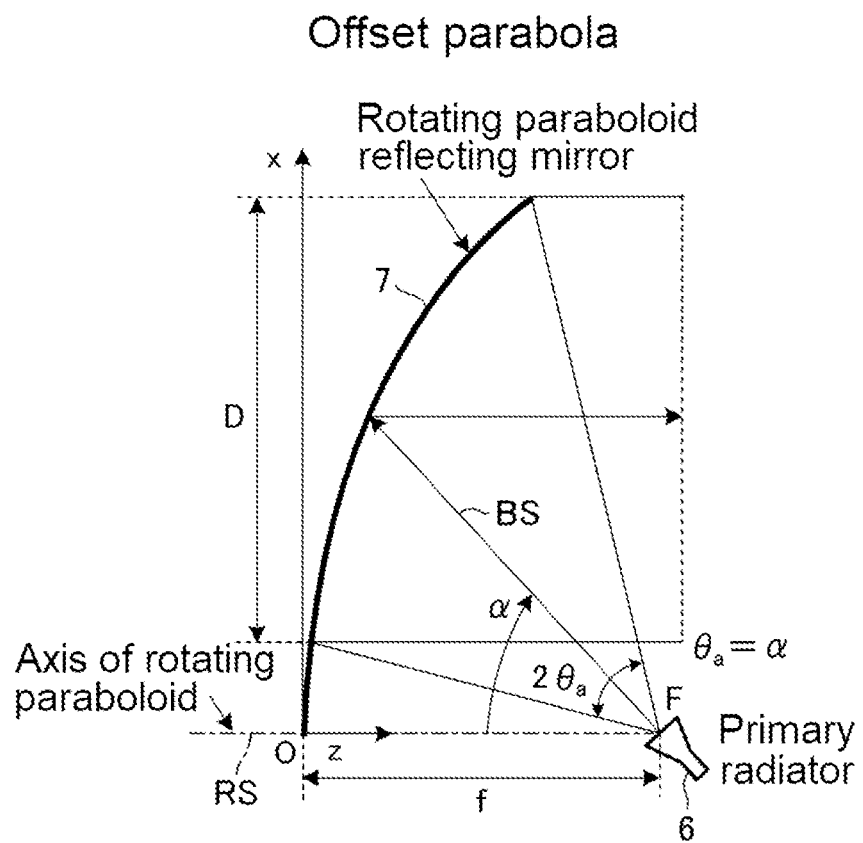
FIG. 7 is a schematic diagram illustrating a structure of a reflection type test antenna used in the temperature test apparatus according to the embodiment of the present invention.

FIG. 7 is a schematic diagram illustrating the structure of the reflector 7. The reflector 7 is an offset parabolic type and has a mirror surface (shape obtained by cutting out a portion of the rotating paraboloid of a perfect circular parabola) that is asymmetric with respect to the axis of the rotating paraboloid. The test antenna 6 as the primary radiator is located at the focal position F of the offset parabolic type in an offset state in which a beam axis BS is tilted from an axis RS of the rotating paraboloid, for example, by an angle α (for example, 30°). In other words, the test antenna 6 is disposed to face the reflector 7 at an elevation angle α, and the reception surface of the test antenna 6 is held at an angle perpendicular to the beam axis BS of the radio signal.

With such a configuration, a radio wave (for example, test signal for the DUT 100) radiated from the test antenna 6 is reflected by the rotating paraboloid in a direction parallel to an axial direction of the rotating paraboloid, and a radio wave (for example, measurement target signal transmitted from the DUT 100) incident to the rotating paraboloid in the direction parallel to the axial direction of the rotating paraboloid is reflected by the rotating paraboloid, and thus the radio waves can be guided to the test antenna 6. Compared to the parabolic type, the offset parabola requires the reflector 7 to be smaller and can be disposed so that the mirror surface becomes close to being a vertical surface. Thus, it is possible to reduce the size of the structure of the OTA chamber 50.

Next, a link antenna will be described.

In the OTA chamber 50, two types of link antennas 5 and 8 are attached to the required positions of the chamber body 51 by holders 57 and 59, respectively. The link antennas are provided in order to establish or maintain a link (call) with the DUT 100. The link antenna 5 is a link antenna for LTE, and is used in a non-standalone mode. The link antenna 8 is a link antenna for 5G and is used to maintain a 5G call. The link antennas 5 and 8 are held by the holders 57 and 59, respectively, so as to have directivity with respect to the DUT 100 held by the posture changeable mechanism 60. Since it is possible to use the test antenna 6 as the link antenna instead of using the above link antennas 5 and 8, description will be made below on the assumption that the test antenna 6 also has a function of the link antenna.

Heat Insulating Housing

Next, the heat insulating housing 70 accommodated in the internal space 54 of the OTA chamber 50 will be described.

Figure 8:
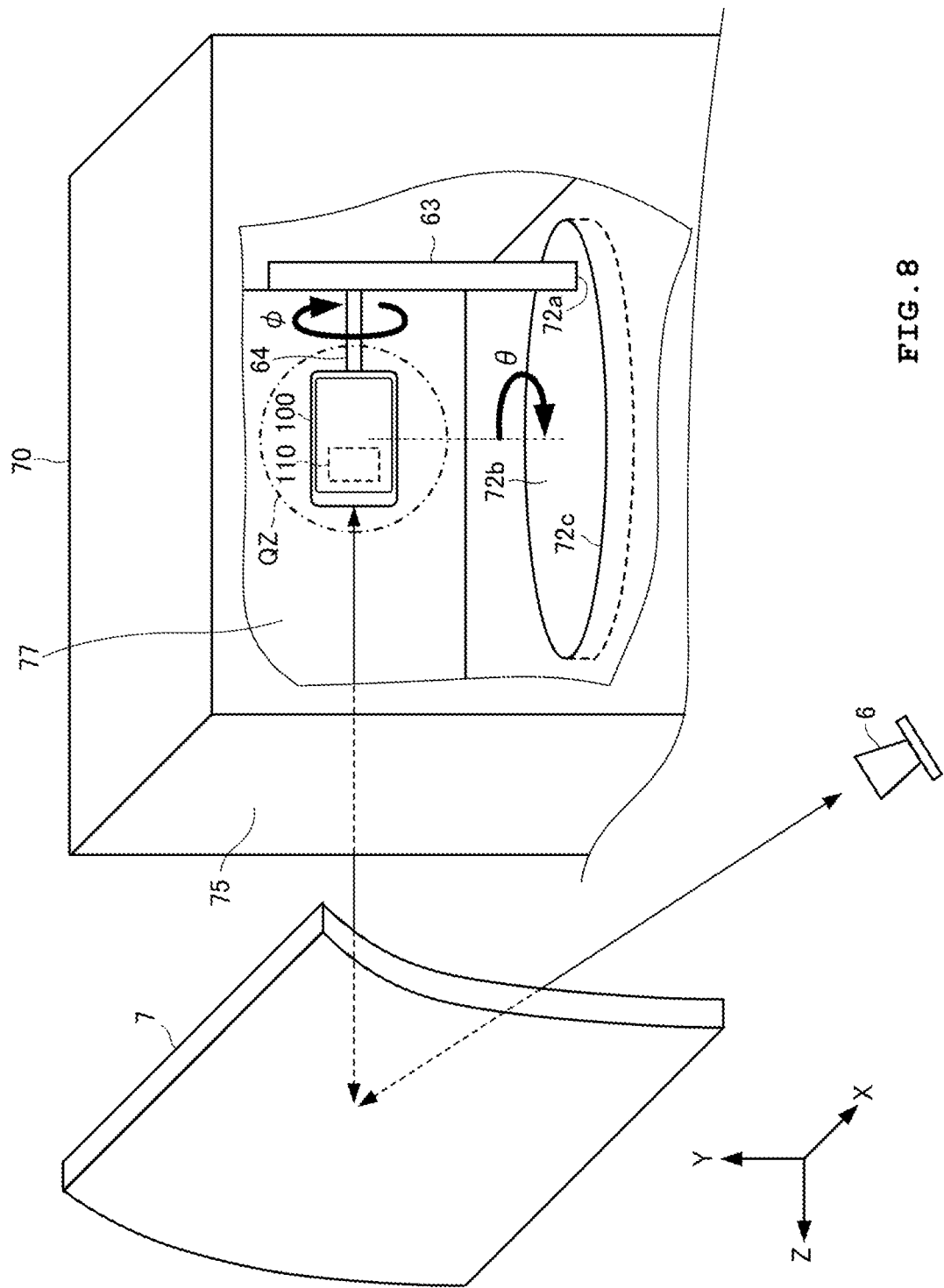
FIG. 8 is a perspective view illustrating a schematic configuration of a heat insulating housing in the temperature test apparatus according to the embodiment of the present invention.

The heat insulating housing 70 maintains the ambient temperature of the DUT 100 to be constant at each set temperature when the temperature test is performed by sequentially changing the ambient temperature of the DUT 100 to a plurality of set temperatures. As illustrated in FIGS. 1 and 8, the heat insulating housing 70 is accommodated in the internal space 54 of the OTA chamber 50, and is made of a heat insulating material to surround a spatial region 77 including at least the quiet zone QZ in a sealed state. The DUT 100, the DUT mounting portion 64, and a portion of the fulcrum 63 are accommodated in the spatial region 77.

As illustrated in FIG. 8, in the region of the heat insulating housing 70 through which the radio wave of a radio signal transmitted from the test antenna 6 passes before entering into the quiet zone QZ, a flat plate-like portion (front-side plate 75) is formed. The flat plate-like portion has a uniform thickness and is perpendicular to a traveling direction of the radio wave of the radio signal entering into the quiet zone QZ. The flat plate-like portion (front-side plate 75) is provided in the portion of the heat insulating housing 70 through which the radio wave of the test signal that is considered as a plane wave, and is transmitted from the test antenna 6 and then enters into the heat insulating housing 70 passes before entering into the quiet zone QZ.

The heat insulating material forming the heat insulating housing 70 is desirably a material having a dielectric constant close to that of air and having a small dielectric loss. For example, foams such as expanded polystyrene (EPS), polymethacrylicimide hard foam, or polytetrafluoroethylene (PTFE) can be used.

The heat insulating housing 70 is configured as illustrated in FIGS. 1 and 8 in order to enable rotation of the posture changeable mechanism 60 equipped with the DUT 100 in a state where the heat insulating housing 70 is installed in the internal space 54 of the OTA chamber 50. That is, the heat insulating housing 70 has a through-hole 72a through which a portion of the fulcrum 63 penetrates. The heat insulating housing includes a disk-shaped rotating portion 72b and a hole 72c. The rotating portion 72b rotates together with the turntable 62 and the fulcrum 63. The hole 72c has an inner diameter that is substantially equal to the outer diameter of the rotating portion 72b and accommodates the rotating portion 72b to be slidable and rotatable. For example, it is possible to easily form the rotating portion 72b and the hole 72c having an inner diameter that is substantially equal to the outer diameter of the rotating portion 72b, by cutting out a portion of the heat insulating housing made of a heat insulating material in a disk shape.

In the temperature test apparatus 1 in the embodiment, it is important to rotate the posture changeable mechanism 60 equipped with the DUT 100 while keeping the air in the spatial region 77 in the heat insulating housing 70 from leaking to the outside as much as possible. At this time, the friction between the hole 72c and the rotating portion 72b rotating together with the posture changeable mechanism 60 causes a problem that the durability of the heat insulating housing 70 made of the heat insulating material is deteriorated. In order to solve this problem, it is desirable that a friction reduction member is provided on a side wall surface of the rotating portion 72b, that faces the hole 72c, and on an inner wall surface of the hole 72c, that faces the rotating portion 72b. The friction reduction member is provided in order to reduce the friction between the side wall surface and the inner wall surface.

Such a friction reduction member is desirably made of a material having a small coefficient of friction and high self-lubricating property. For example, a film or a sheet made of polyacetal (POM), PTFE, ultra high molecular weight polyethylene (UHPE) or the like can be used.

Next, the structure of the heat insulating housing 70 will be described.

Figure 10:
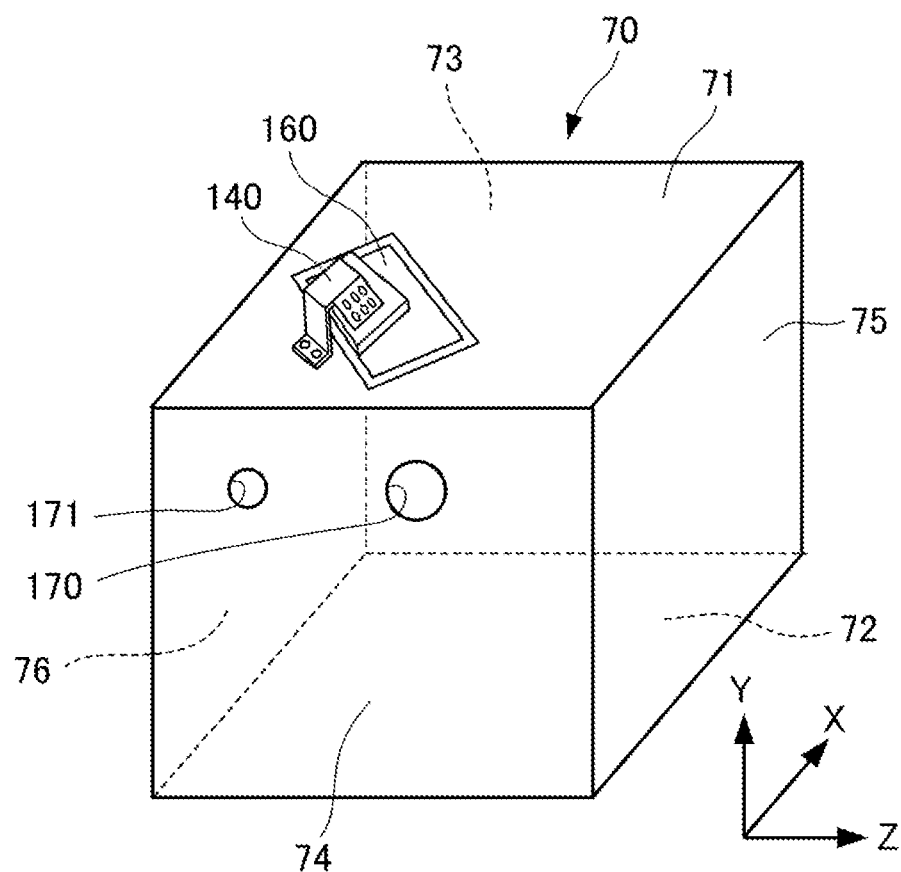
FIG. 10 is an assembly diagram of the heat insulating housing according to an embodiment of the present invention.

FIG. 10 is an assembly diagram of the heat insulating housing 70 in the temperature test apparatus 1 according to the present embodiment. As illustrated in FIG. 10, the heat insulating housing 70 is assembled from a plurality of plate parts made of a heat insulating material, specifically, from a top plate 71, a base plate 72, a front plate 73, a back plate 74, a front-side plate 75, and a rear-side plate 76 to be freely disassembled.

As illustrated in FIGS. 1 and 10, the top plate 71 is disposed on the upper side (ceiling side) of the internal space 54 of the OTA chamber 50. The base plate 72 is disposed on the lower side facing the top plate 71. The front plate 73 is disposed on the door 52a side of the OTA chamber 50 and is openable and closable. The back plate 74 is disposed at a position facing the front plate 73. The front-side plate 75 is disposed at a position intersecting the propagation path of a radio signal, and the rear-side plate 76 is disposed at a position facing the front-side plate 75.

Specifically, the front-side plate 75 is disposed to be openable and closable in the propagation path of a radio signal that is transmitted and received between the test antenna 6 and the DUT 100. With this configuration, in the temperature test, the front-side plate 75 disposed in the propagation path of the radio signal is closed to form the heat insulating housing 70 that maintains the spatial region 77 at a constant temperature. In a test other than the temperature test, the front-side plate 75 can be opened so that a radio signal directly reaches the DUT 100 without passing through the front-side plate 75. Thus, it is possible to support a temperature test that measures the temperature dependency of transmission and reception characteristics of the DUT 100 by changing the temperature, and to easily support performing of a test for measuring the transmission and reception characteristics of the DUT 100 at room temperature in an environment of avoiding disturbances (deterioration of the quiet zone performance) caused by the heat insulating housing.

The front plate 73 is disposed on the door 52a side of the OTA chamber 50 to be openable and closable. With this configuration, the user can easily perform, for example, a work of disposing the DUT 100 in the heat insulating housing 70, by opening the door 52*a* of the OTA chamber 50 to open the front plate 73.

Camera Device

Next, the infrared camera device 140 will be described.

As illustrated in FIG. 10, the infrared camera device 140 is attached to the outer surface of the top plate 71 of the heat insulating housing 70, and picks up an image of the DUT 100 disposed in the heat insulating housing 70 through a viewing window 160. The image of the DUT 100 picked up by the infrared camera device 140 is displayed on a display unit 13.

Temperature Control Device

Next, the temperature control device 120 will be described.

Figure 9:
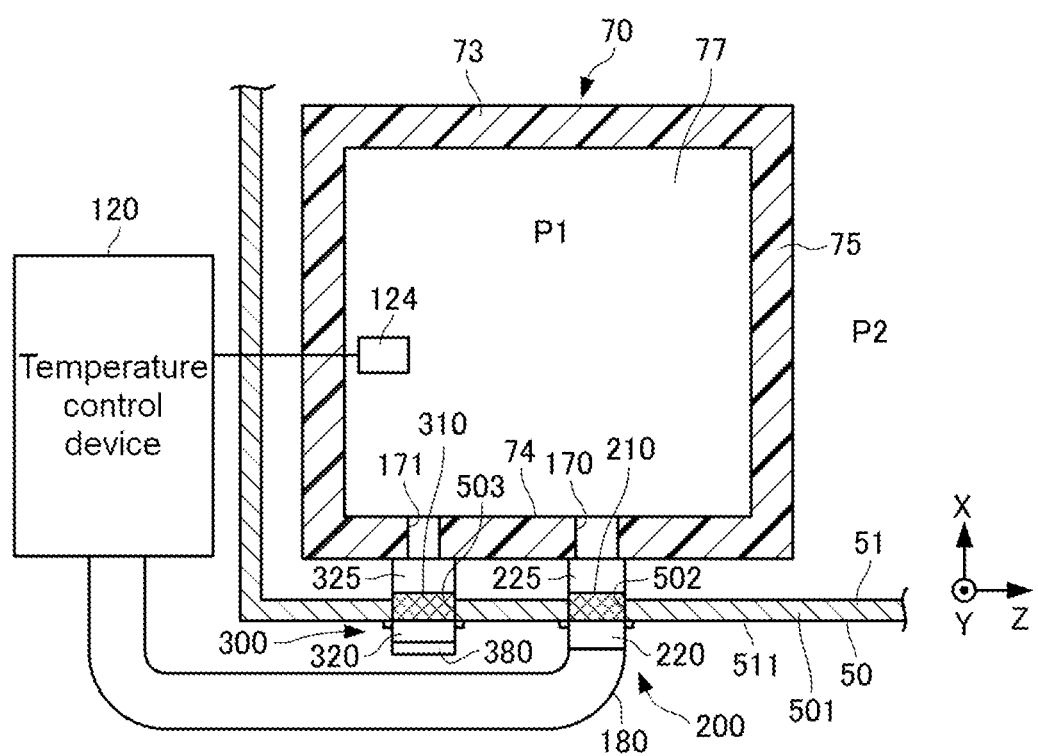
FIG. 9 is a schematic diagram illustrating temperature control in the heat insulating housing by a temperature control device in the temperature test apparatus according to the embodiment of the present invention.

FIG. 9 is a schematic diagram illustrating the temperature control of air (for example, gas) in the heat insulating housing 70 by the temperature control device 120. Descriptions will be made below on the assumption that the gas is air, but other gases may be used. The temperature control device 120 is capable of controlling the air temperature in the spatial region 77 of the heat insulating housing 70 to a desired predetermined temperature. For this purpose, the temperature control device 120 generates temperature-controlled (heated or cooled) air and supplies the generated air to the heat insulating housing 70.

An intake port 170 and an exhaust port 171 that penetrate the back plate 74 are provided in the back plate 74 of the heat insulating housing 70. The temperature control device 120 and the intake port 170 of the heat insulating housing 70 are connected to each other by a pipe 180 for sending temperature-controlled air and an intake-system electromagnetic shield structure 200. Thus, the air having a temperature controlled by the temperature control device 120 is supplied from the intake port 170 to the inside of the heat insulating housing 70 through the pipe 180.

The exhaust port 171 of the heat insulating housing 70 is joined to the exhaust fan 380 at the chamber back surface 511 of the OTA chamber 50 by an exhaust-system electromagnetic shield structure 300. Thus, the air extruded from the inside of the heat insulating housing 70 by the inflow of air from the intake port 170 is forcibly discharged from the exhaust port 171 to the outside of the OTA chamber 50 through the exhaust fan 380.

A temperature sensor 124 for monitoring the air temperature in the spatial region 77 is provided in the heat insulating housing 70. The temperature sensor 124 is connected to the temperature control device 120.

Figure 4:
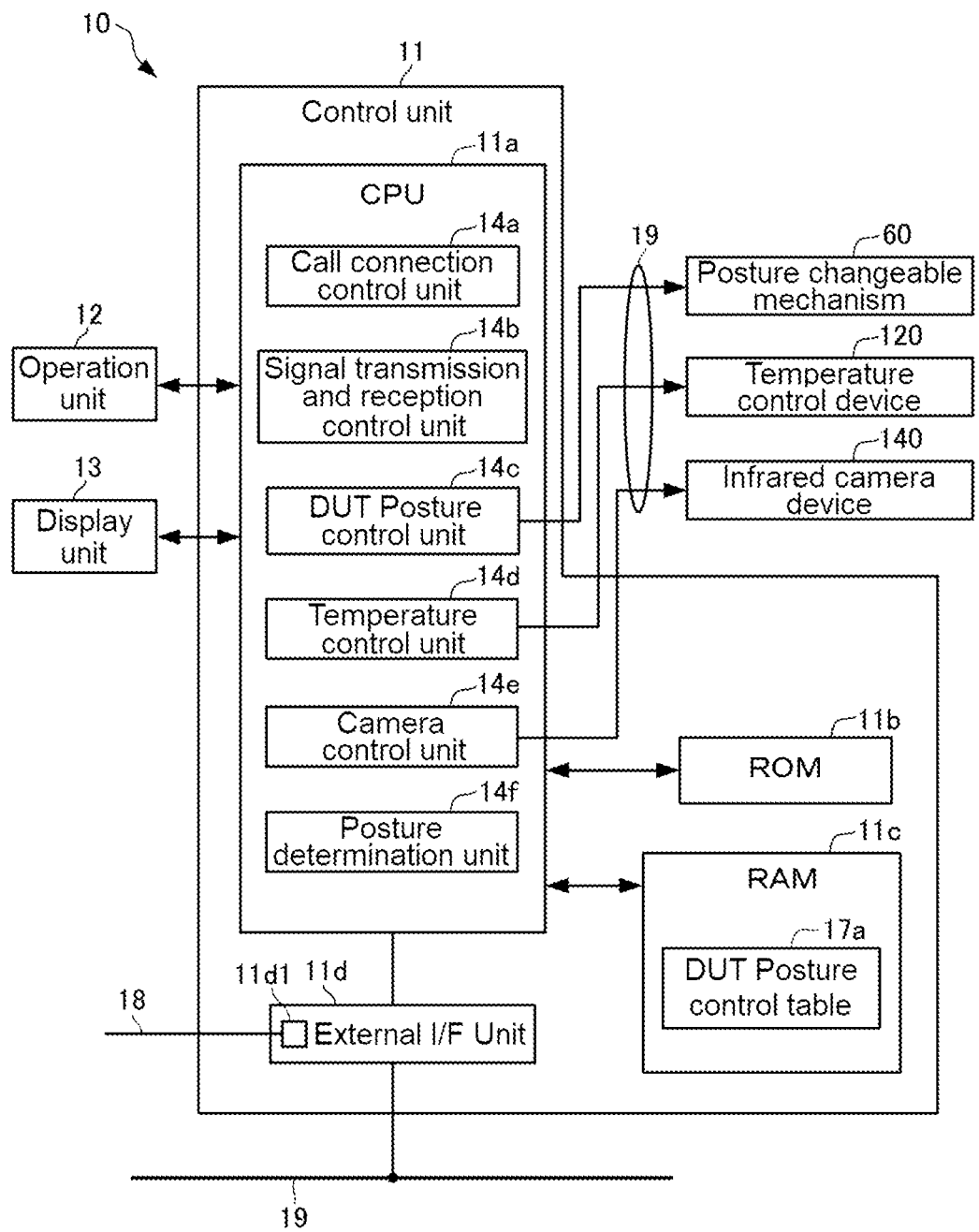
FIG. 4 is a block diagram illustrating a functional configuration of an integrated control device in the temperature test apparatus according to the embodiment of the present invention.

The temperature control device 120 generates the heated or cooled air so that the temperature instruction value of the temperature sensor 124 is equal to the temperature setting value input by an operation of a user on an operation unit 12 (see FIG. 4). In this manner, the temperature control device 120 sends air having any temperature in a range of, for example, −40° C. to 80° C. into the heat insulating housing 70, and thus controls the temperature in the heat insulating housing 70 in a range of, for example, −10° C. to 55° C.

Intake Port and Exhaust Port

Next, the intake port 170 and the exhaust port 171 of the heat insulating housing 70 will be described.

As illustrated in FIG. 10, the intake port 170 and the exhaust port 171 that penetrate the back plate 74 are formed in the back plate 74 of the heat insulating housing 70. As illustrated in FIG. 9, the air having a temperature controlled by the temperature control device 120 is sent from the intake port 170 to the inside of the heat insulating housing 70 through the pipe 180. The air in the heat insulating housing 70 is discharged from the exhaust port 171 to the outside of the OTA chamber 50 by the exhaust fan 380 through the exhaust-system electromagnetic shield structure 300. The air in the heat insulating housing 70 may be sent from the exhaust port 171 to the temperature control device 120 and discharged to the outside from the temperature control device 120.

The intake port 170 and the exhaust port 171 are circular openings, and the diameter of the opening portion of the exhaust port 171 is smaller than the diameter of the opening portion of the intake port 170. That is, the area of the opening portion of the exhaust port 171 is smaller than the area of the opening portion of the intake port 170.

With such a configuration, it is difficult for the air in the heat insulating housing 70 to be physically discharged as compared with the introduction of air into the heat insulating housing 70. Thus, a time during which the temperature-controlled air stays in the heat insulating housing 70 increases, and thus it is possible to efficiently make the temperature in the heat insulating housing 70 uniform. The shapes of the intake port 170 and the exhaust port 171 are not limited to a circle, and any shape such as an ellipse or a rectangle can be adopted.

Electromagnetic Shield Structure

Next, an electromagnetic shield structure for preventing leakage of radio waves from the OTA chamber 50 to the outside and intrusion of unnecessary radio waves from the outside into the OTA chamber 50 will be described.

An opening 502 for intake is formed in an outer surface plate 501 of the OTA chamber 50. The air having a temperature controlled by the temperature control device 120 is sent from the intake port 170 into the heat insulating housing 70 through the opening 502. The intake-system electromagnetic shield structure 200 is provided in the opening 502 of the OTA chamber 50 in order to prevent leakage of a radio wave from the opening 502 of the OTA chamber 50 and the like.

In addition, an exhaust opening 503 is formed in the outer surface plate 501 of the OTA chamber 50. The air in the heat insulating housing 70 is sent from the exhaust port 171 of the heat insulating housing 70 to the exhaust fan 380 through the opening 503. The exhaust-system electromagnetic shield structure 300 is provided in the opening 503 of the OTA chamber 50 in order to prevent leakage of a radio wave from the opening 503 of the OTA chamber 50 and the like.

Intake-System Electromagnetic Shield Structure

Figure 11:
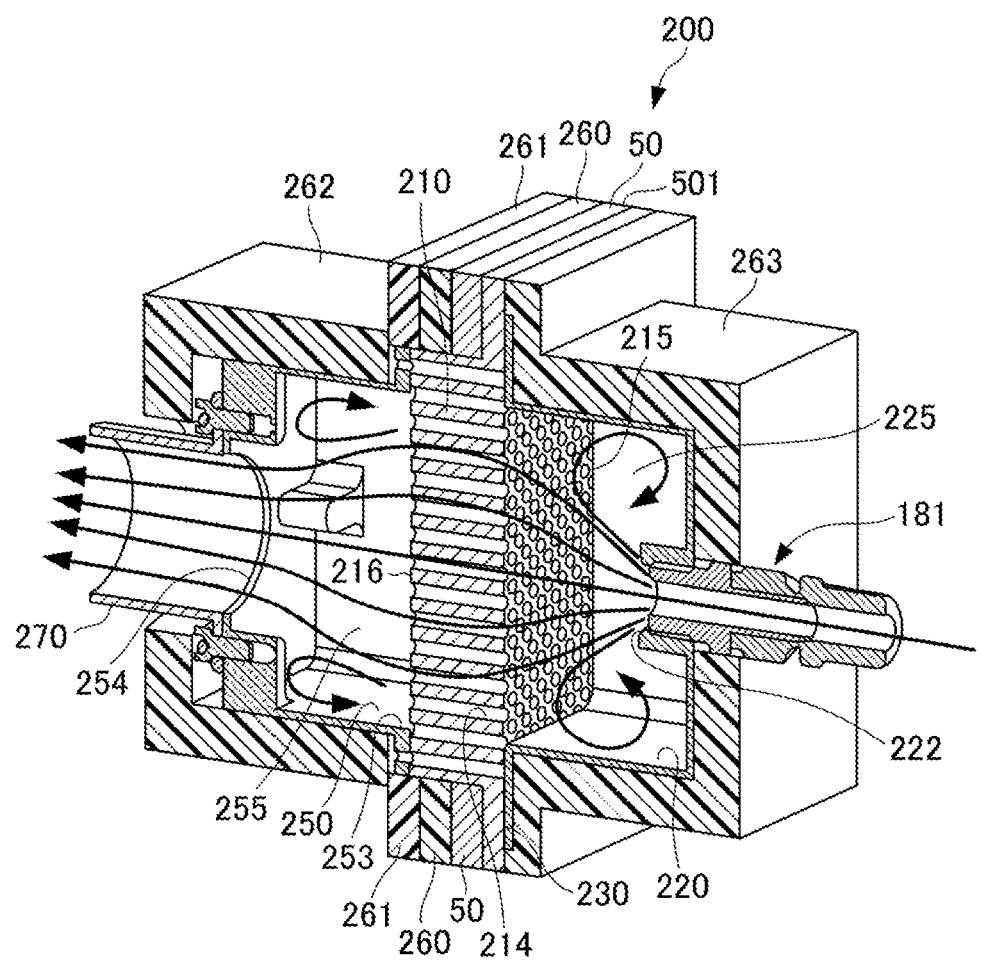
FIG. 11 is a cross-sectional perspective view of an intake-system electromagnetic shield structure.
Figure 12:
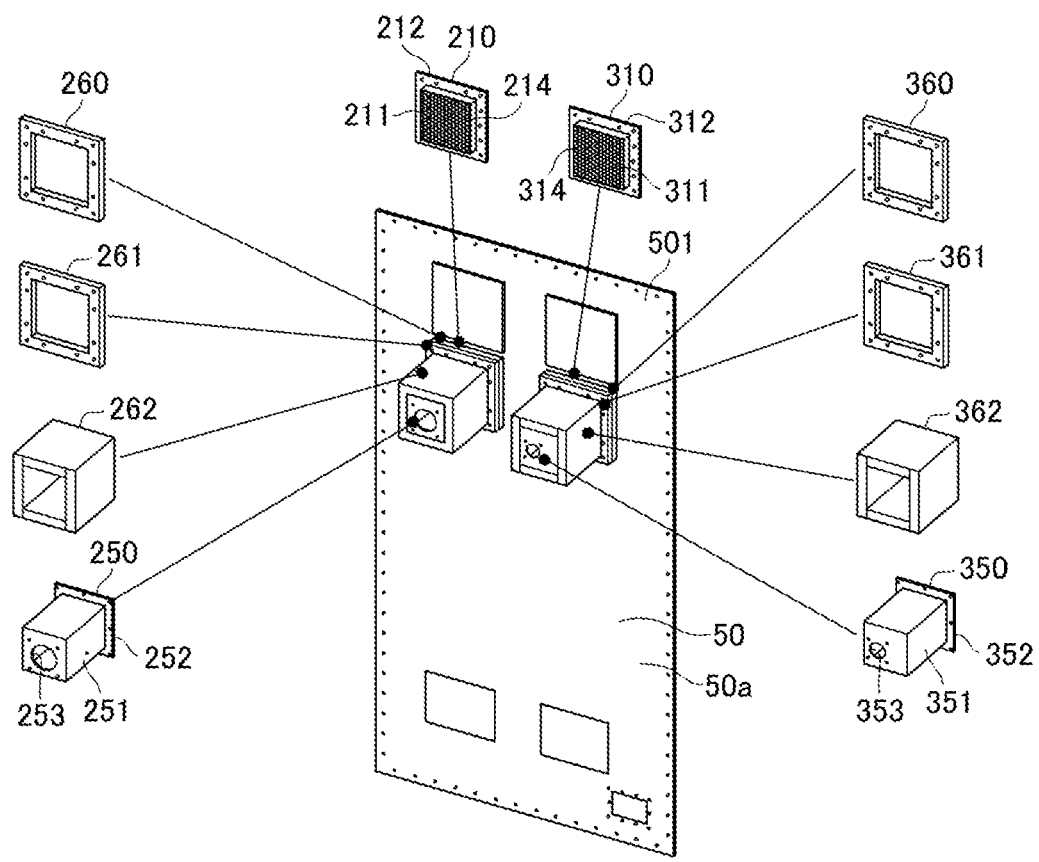
FIG. 12 is exploded explanatory view of the intake-system electromagnetic shield structure and an exhaust-system electromagnetic shield structure on an inner side of the OTA chamber.
Figure 13:
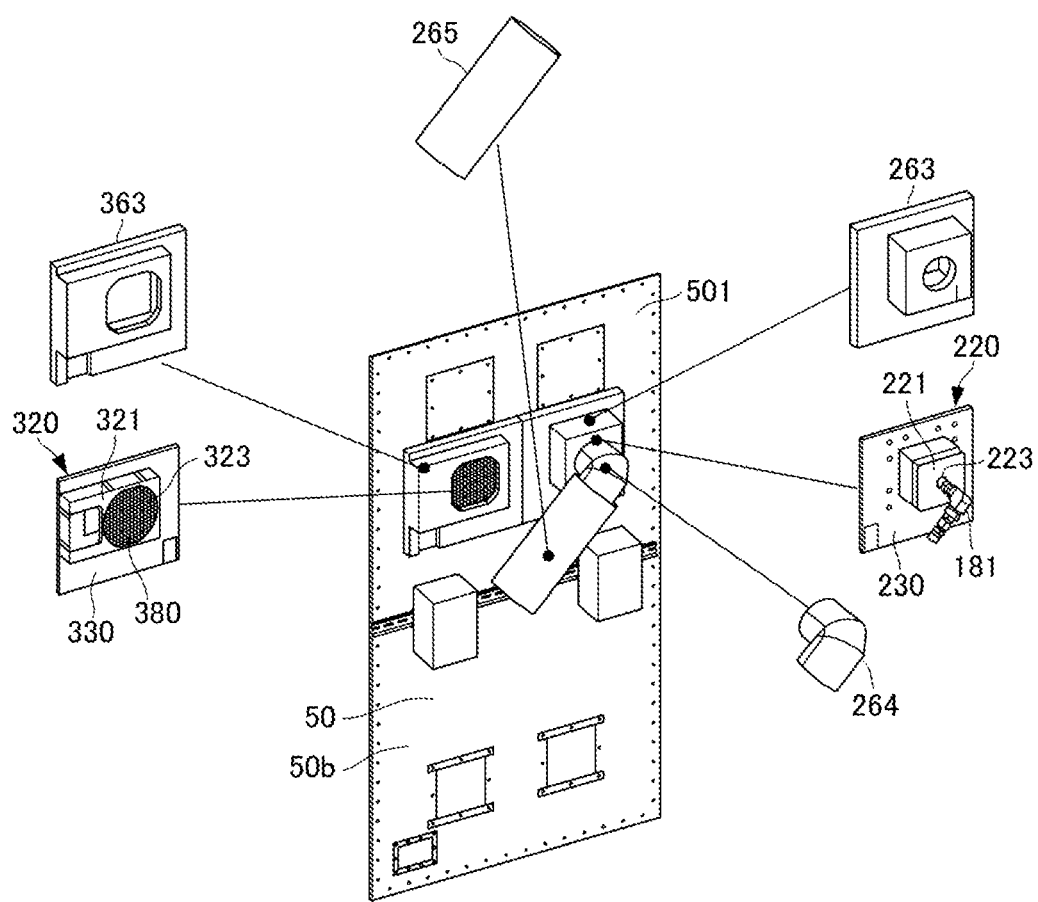
FIG. 13 is exploded explanatory view of the intake-system electromagnetic shield structure and the exhaust-system electromagnetic shield structure on an outer side of the OTA chamber.

FIG. 11 is a cross-sectional perspective view of the intake-system electromagnetic shield structure 200. FIG. 12 is an exploded explanatory view of the intake-system electromagnetic shield structure 200 and the exhaust-system electromagnetic shield structure 300 inside the OTA chamber 50. FIG. 13 is an exploded explanatory view of the intake-system electromagnetic shield structure 200 and the exhaust-system electromagnetic shield structure 300 outside the OTA chamber 50. As illustrated in FIGS. 9 and 11 to 13, the intake-system electromagnetic shield structure 200 includes a ventilation block 210, a first cover 220, a second cover 250, and heat insulating materials 260 to 263. The components will be described below.

Ventilation Block

The ventilation block 210 is made of metal (for example, made of aluminum or stainless steel). The ventilation block has a rectangular block body 211 and a rectangular block attachment portion 212. In the block body, a plurality of through-holes 214 are formed. The block attachment portion is provided around the block body in a brim shape. The ventilation block 210 is provided to block the rectangular opening 502 formed in the outer surface plate 501 of the OTA chamber 50, and is attached to the outer surface plate 501 of the OTA chamber 50 by the block attachment portion 212 by screwing or the like. The thickness of the block body 211 is thicker than the thickness of the block attachment portion 212 in order to secure the required length of the through-hole 214. The size of the block body 211 is, for example, 120 mm×120 mm×40 mm.

In the block body 211 of the ventilation block 210, a plurality of through-holes 214 that penetrate the block body 211 from one end surface 215 to the other end surface 216 are formed in parallel with each other. The diameter and the length of the through-holes 214 (that is, the thickness of the block body 211) are defined based on the wavelength of a radio wave that is electromagnetically shielded.

The shape of the through-hole 214 of the ventilation block 210 is not limited to a circle, and may have any shape. The size of the through-hole 214 may be set an extent of be capable of functioning as an electromagnetic shield and being required to interfere with the flow of temperature-controlled air. In the embodiment, when the thickness of the ventilation block 210 is about 40 mm, the size of the through-hole is, for example, about 4 mm in diameter. By appropriately selecting the plate thickness of the ventilation block 210 and the size of the through-hole 214 as described above, the through-hole 214 of the ventilation block 210 forms a waveguide structure, and it is possible to select a frequency in accordance with the size of a waveguide. Thus, the performance of the electromagnetic shield is improved.

Instead of the ventilation block 210 having a configuration described above, a net structure in which metal strands are formed in a mesh shape, which functions as an electromagnetic shield, can also be used.

Figure 18:
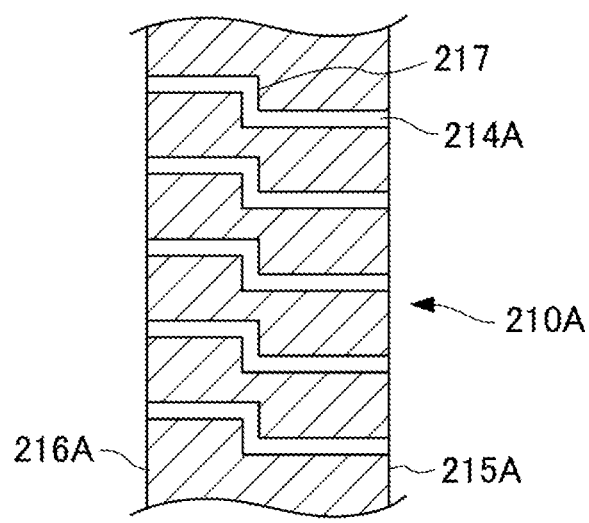
FIG. 18 is a partial cross-sectional view of another ventilation block.

FIG. 18 is a partial cross-sectional view of the ventilation block in a modification example. As illustrated in FIG. 18, a through-hole 214A of a ventilation block 210A has a curved portion 217 between one end surface 215A and the other end surface 216A. With this configuration, traveling of a radio wave that has strong straightness and has a short wavelength is blocked at the curved portion 217 of the through-hole 214A. The radio wave is leaked to the outside less frequently, and intrusion from the outside occurs less frequently.

First Cover

The first cover 220 is made of resin, for example. The first cover includes a cover body 221 having an open side and a rectangular parallelepiped shape, and a rectangular attachment plate 230 provided around the cover body 221 in a brim shape. The first cover 220 is provided to cover the one end surface 215 of the ventilation block 210 on the outer side of the OTA chamber 50, and is attached to the outer surface plate 501 of the OTA chamber 50 by the attachment plate 230 by screwing or the like.

The first cover 220 includes a first communication hole 223 for forming a first space 225 with the ventilation block 210 and causing the first space 225 to communicate with the external pipe 180 of the OTA chamber 50. The pipe fitting 181 for connecting the pipe 180 for supplying temperature-controlled air from the temperature control device 120 is attached to the first communication hole 223 of the first cover 220.

Second Cover

Like the first cover 220, the second cover 250 is also made of resin, for example. The second cover 250 has a cover body 251 having an open side and a rectangular parallelepiped shape and a rectangular cover attachment portion 252 provided around the cover body 251 in a brim shape. The second cover 250 is provided to cover the ventilation block 210 on the inner side of the OTA chamber 50, and is attached to the ventilation block 210 or the outer surface plate 501 of the OTA chamber 50 by the cover attachment portion 252 by screwing or the like.

The second cover 250 includes a second communication hole 253 for forming a second space 255 with the ventilation block 210 and causing the second space 255 to communicate with the inside of the heat insulating housing 70. A configuration in which an intake pipe 270 leading to the intake port 170 of the heat insulating housing 70 is attached to the second communication hole 253 of the second cover 250 may be made.

Figure 14:
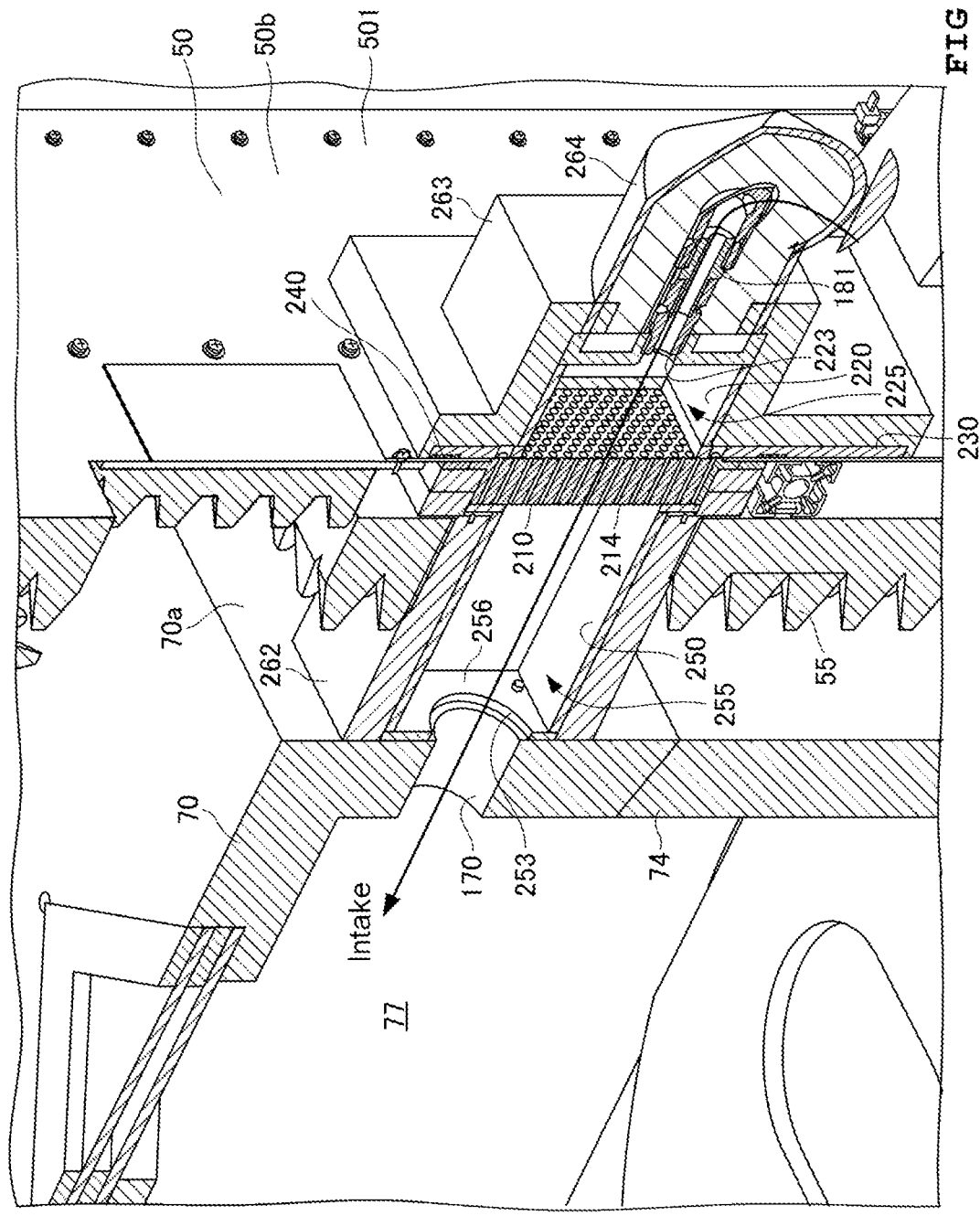
FIG. 14 is a cross-sectional perspective view of the intake-system electromagnetic shield structure assembled in the temperature test apparatus.

FIG. 14 is a cross-sectional perspective view of the intake-system electromagnetic shield structure 200 assembled to the temperature test apparatus 1. As illustrated in FIG. 14, an end surface 256 in which the second communication hole 253 of the second cover 250 is formed is attached to the outer surface 70a of the heat insulating housing 70 so that the second communication hole 253 corresponds to the intake port 170 of the heat insulating housing 70. With this configuration, the second cover 250 may just be attached to the outer surface 70a of the heat insulating housing 70, and it is not necessary to dispose an intake or exhaust pipe to be drawn. Thus, the assembly work is easily performed.

The first cover 220 and the second cover 250 are preferably made of a non-metal material that has higher heat insulating properties than metal, and is lightweight and inexpensive. For example, the first cover 220 and the second cover 250 can be made of resin (for example, made of bakelite).

Heater

Figure 16:
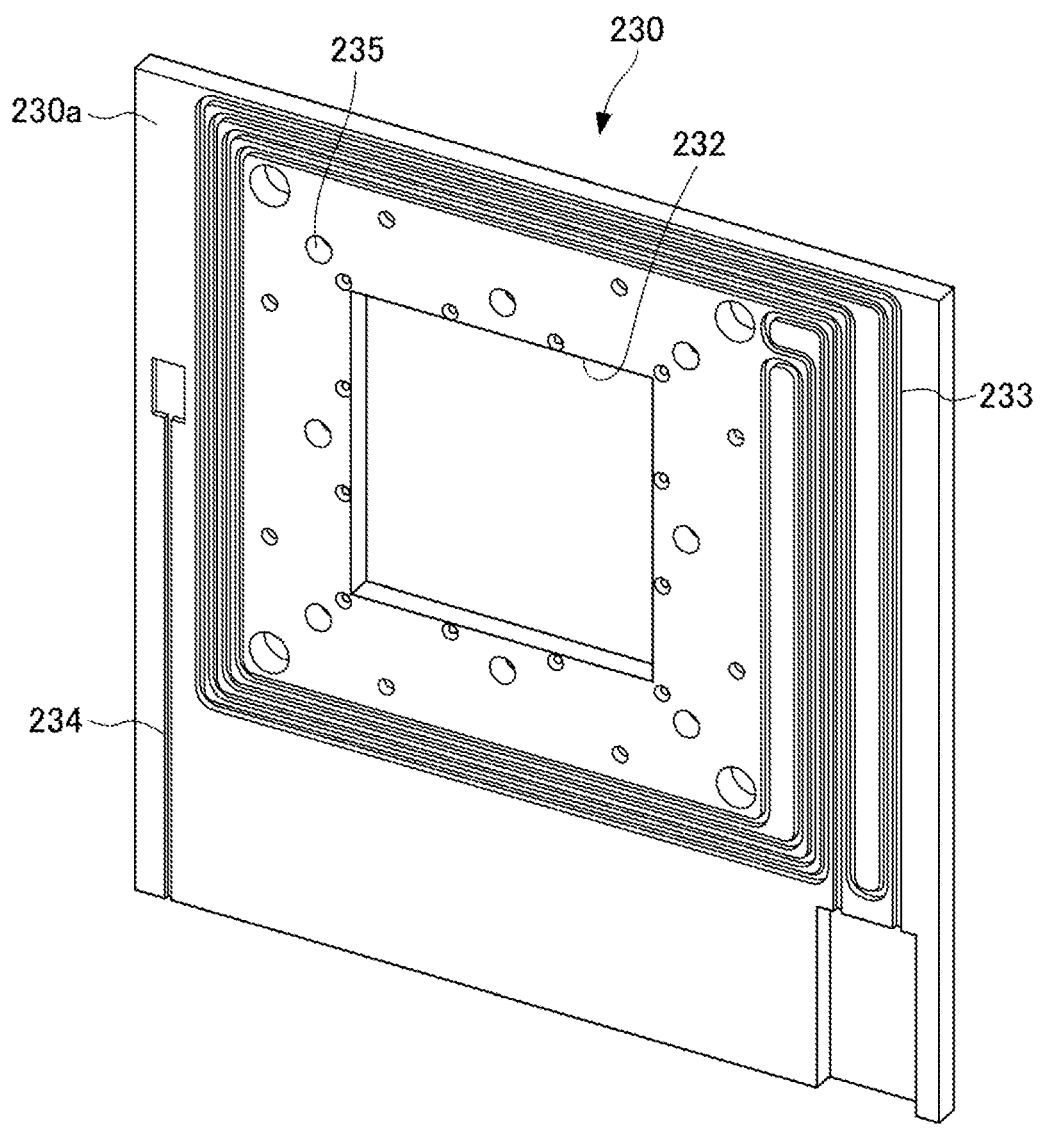
FIG. 16 is a perspective view of an attachment plate of a first cover in the intake-system electromagnetic shield structure.

FIG. 16 is a perspective view of the attachment plate 230 of the first cover 220. As illustrated in FIG. 16, the attachment plate 230 has a plate shape having an opening portion 232 corresponding to the opening 502 of the outer surface plate 501 of the OTA chamber 50. The attachment plate screws the cover body 221 by using an attachment hole 235 around the opening portion 232.

In the attachment plate 230, on a surface 230a on an opposite side of a surface on which the cover body 221 is located, a groove 233 for heater wiring is formed around the opening portion 232, and a groove 234 for thermocouple wiring is formed. A heater 240 (for example, 20 to 30 W) for heating is accommodated in the groove 233 for the heater wiring, and the thermocouple for temperature measurement is accommodated in the groove 234 for the thermocouple wiring.

The attachment plate 230 is attached on the outer surface plate 501 from the outside so that the surface 230a faces the outer surface plate 501 of the OTA chamber 50 in a state of accommodating the heater 240 and the thermocouple.

Heat Insulating Material

As illustrated in FIGS. 11 to 13, the outside of the first cover 220 is covered with a heat insulating material 263. The outside of the pipe fitting 181 is covered with a heat insulating material 264. A portion of the pipe 180 connected to the pipe fitting 181 is covered with a heat insulating material 265. The inside of the outer surface plate 501 of the OTA chamber 50 and the peripheral surface portion of the ventilation block 210 are covered with a heat insulating material 260 and a heat insulating material 261. The second cover 250 is covered with a heat insulating material 262.

As described above, the intake-system electromagnetic shield structure 200 and the outer surface plate 501 of the OTA chamber 50 to which the intake-system electromagnetic shield structure 200 is attached are covered with heat insulating materials, and the outer surface plate 501 is heated from the outer side by the heater 240 disposed on the attachment plate 230. Thus, an occurrence of dew condensation on the outer side and the inner side of the outer surface plate 501 is prevented.

The air having a temperature controlled by the temperature control device 120 enters into the first space 225 in the first cover 220 from the pipe 180 through the pipe fitting 181, and enters into the second space 255 in the second cover 250 through the through-hole 214 of the ventilation block 210, and then enters into the inside of the heat insulating housing 70 through the second communication hole 253 and the intake port 170 of the heat insulating housing 70.

Exhaust-System Electromagnetic Shield Structure

Next, the exhaust-system electromagnetic shield structure 300 will be described.

The exhaust-system electromagnetic shield structure 300 is different from the intake-system electromagnetic shield structure 200 in that the exhaust fan 380 is attached to the first cover 320 provided on the outer side of the outer surface plate 501 of the OTA chamber 50.

Figure 15:
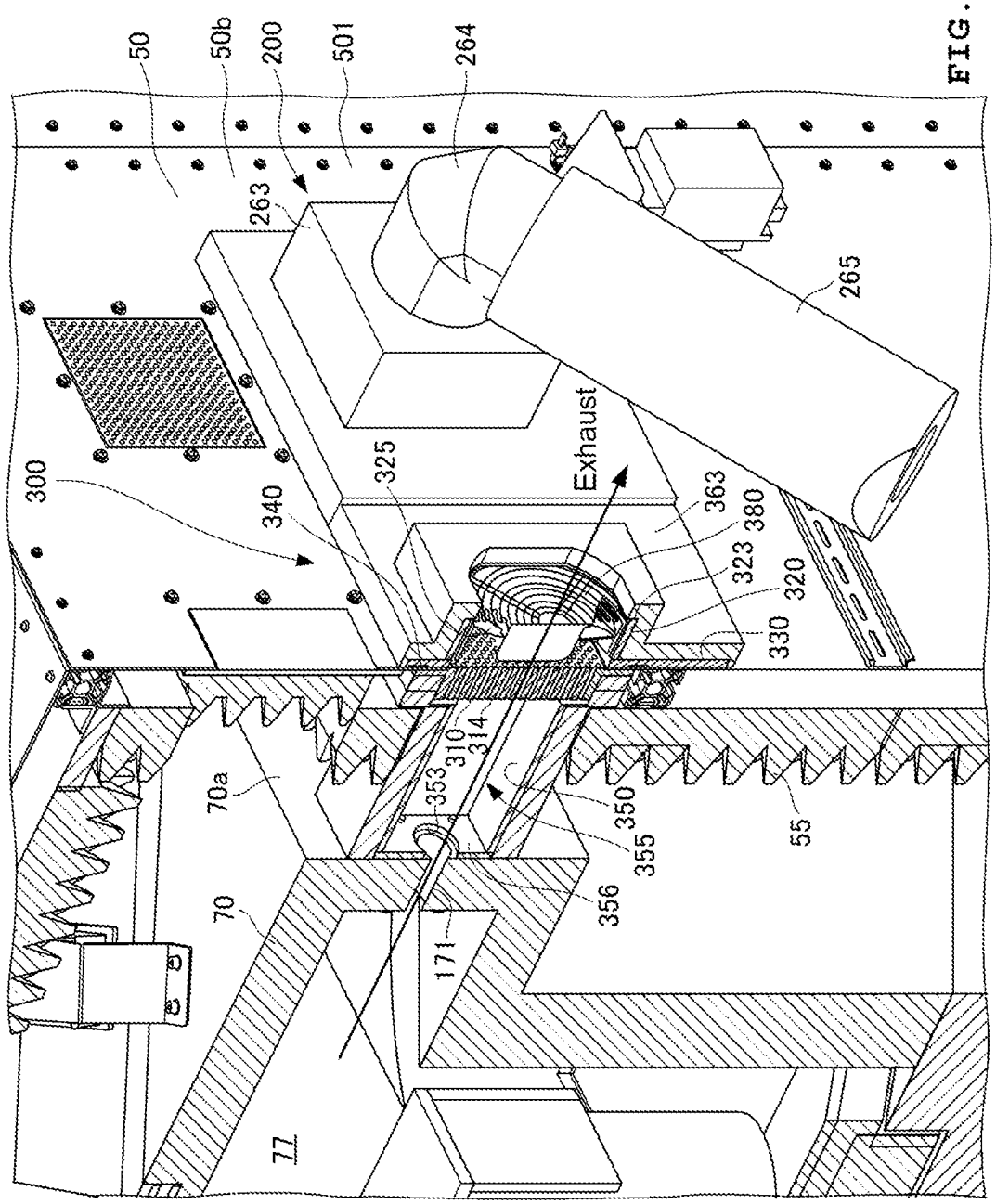
FIG. 15 is a cross-sectional perspective view of the exhaust-system electromagnetic shield structure assembled in the temperature test apparatus.

As illustrated in FIGS. 12, 13, and 15, the exhaust-system electromagnetic shield structure 300 includes a ventilation block 310, a first cover 320, a second cover 350, and heat insulating materials 360 to 363. The components will be described below.

Ventilation Block

The ventilation block 310 has the same structure as the ventilation block 210 of the intake-system electromagnetic shield structure 200. The ventilation block 310 is provided to block the exhaust opening 503 formed in the outer surface plate 501 of the OTA chamber 50. A plurality of through-holes 314 are formed as ventilation holes in the metal block body 311.

First Cover

The first cover 320 is made of non-metal, preferably resin (for example, made of bakelite). The first cover has a cover body 321 having an open side and a rectangular parallelepiped shape, and a rectangle attachment plate 330 provided around the cover body 321 in a brim shape. The first cover 320 is provided to cover the ventilation block 310 on the outer side of the OTA chamber 50, and is attached to the outer surface plate 501 of the OTA chamber 50 by the attachment plate 330 by screwing or the like.

The first cover 320 includes a first communication hole 323 for forming a first space 325 with the ventilation block 310 and causing the first space 325 to communicate with the outside of the OTA chamber 50. An exhaust fan 380 for forcibly discharging the air in the heat insulating housing 70 to the outside of the OTA chamber 50 is attached to the first communication hole 323 of the first cover 320.

Second Cover

Like the first cover 320, the second cover 350 is also made of resin, for example. The second cover 350 has a cover body 351 having an open side and a rectangular parallelepiped shape and a rectangular cover attachment portion 352 provided around the cover body 351 in a brim shape. The second cover 350 is provided to cover the ventilation block 310 on the inner side of the OTA chamber 50, and is attached to the ventilation block 310 or the outer surface plate 501 of the OTA chamber 50 by the cover attachment portion 352 by screwing or the like.

The second cover 350 includes a second communication hole 353 for forming a second space 355 with the ventilation block 310 and causing the second space 355 to communicate with the inside of the heat insulating housing 70.

FIG. 15 is a cross-sectional perspective view of the exhaust-system electromagnetic shield structure 300 assembled to the temperature test apparatus 1. As illustrated in FIG. 15 an end surface 356 in which the second communication hole 353 of the second cover 350 is formed is attached to the outer surface 70a of the heat insulating housing 70 so that the second communication hole 353 corresponds to the exhaust port 171 of the heat insulating housing 70. With this configuration, the second cover 350 may just be attached to the outer surface 70a of the heat insulating housing 70, and it is not necessary to dispose an intake or exhaust pipe to be drawn. Thus, the assembly work is easily performed.

The second communication hole 353 of the second cover 350 has the same size as the exhaust port 171 formed to be smaller than the intake port 170 of the heat insulating housing 70. With this configuration, a time during which the air having a temperature controlled by the temperature control device 120 stays in the heat insulating housing 70 increases, and thus it is possible to efficiently make the temperature in the heat insulating housing 70 uniform.

Heater

Figure 17:
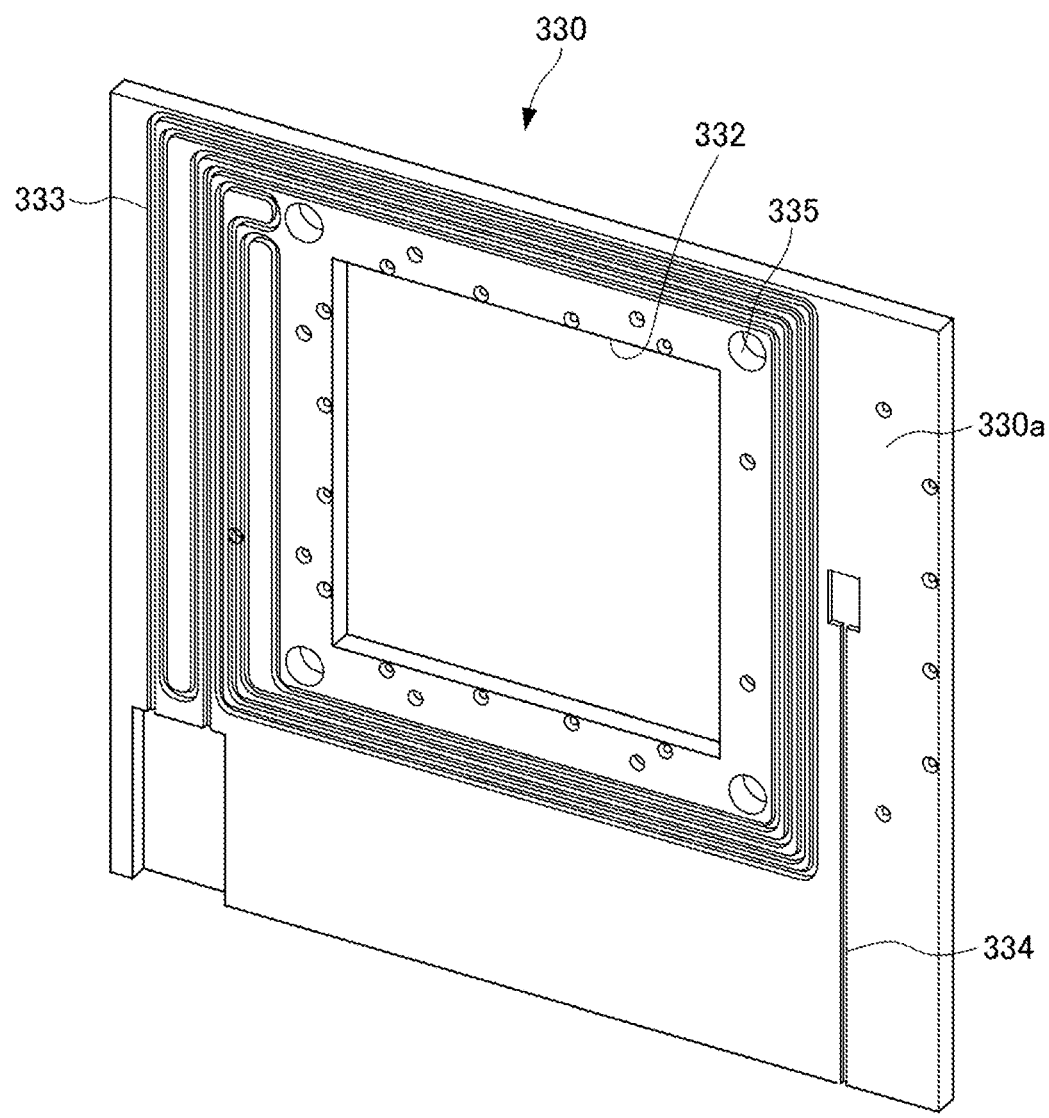
FIG. 17 is a perspective view of the attachment plate of the first cover in the exhaust-system electromagnetic shield structure.

FIG. 17 is a perspective view of the attachment plate 330 of the first cover 320. As illustrated in FIG. 17, the attachment plate 330 has a plate shape having an opening portion 332 corresponding to the opening 503 of the outer surface plate 501 of the OTA chamber 50. The attachment plate screws the cover body 321 by using an attachment hole 335 around the opening portion 332.

In the attachment plate 330, on a surface 330a on an opposite side of a surface on which the cover body 321 is located, a groove 333 for heater wiring is formed around the opening portion 332, and a groove 334 for thermocouple wiring is formed. A heater 340 (for example, 20 to 30 W) for heating is accommodated in the groove 333 for the heater wiring, and the thermocouple for temperature measurement is accommodated in the groove 334 for the thermocouple wiring.

The attachment plate 330 is attached on the outer surface plate 501 from the outside so that the surface 330a faces the outer surface plate 501 of the OTA chamber 50 in a state of accommodating the heater 340 and the thermocouple.

Heat Insulating Material

As illustrated in FIGS. 12, 13, and 15, the outside of the first cover 320 is covered with a heat insulating material 363. The inside of the outer surface plate 501 of the OTA chamber 50 and the peripheral surface portion of the ventilation block 310 are covered with heat insulating materials 360 and 361. The second cover 350 is covered with a heat insulating material 362.

As described above, the exhaust-system electromagnetic shield structure 300 and the outer surface plate 501 of the OTA chamber 50 to which the exhaust-system electromagnetic shield structure 300 is attached are covered with heat insulating materials, and the outer surface plate 501 is heated from the outer side by the heater 340 disposed on the attachment plate 330. Thus, an occurrence of dew condensation on the outer side and the inner side of the outer surface plate 501 is prevented.

The air in the heat insulating housing 70 enters into the second space 355 through the exhaust port 171 and the second communication hole 353, enters into the first space 325 of the first cover 320 through the through-hole 314 of the ventilation block 310, and then is sent to the exhaust fan 380 through the first communication hole 323.

Next, the measurement device 2 will be described. The measurement device 2 includes the integrated control device 10, the NR system simulator 20, and the signal processing unit 40. The components will be described below.

Integrated Control Device

The integrated control device 10 performs control of measuring the transmission characteristics or the reception characteristics of the DUT 100 each time the posture of the DUT 100 is changed by the posture changeable mechanism 60 in a state where the temperature of the spatial region 77 is controlled by the temperature control device 120. Specifically, as described below, the integrated control device 10 collectively controls the NR system simulator 20, the posture changeable mechanism 60, and the temperature control device 120. Therefore, the integrated control device 10 is communicably connected to the NR system simulator 20, the posture changeable mechanism 60, and the temperature control device 120 via a network 19 such as Ethernet (registered trademark), for example.

FIG. 4 is a block diagram illustrating a functional configuration of the integrated control device 10. As illustrated in FIG. 4, the integrated control device 10 includes a control unit 11, the operation unit 12, and a display unit 13. The control unit 11 is configured by, for example, a computer device. The computer device includes, for example, a central processing unit (CPU) 11a, a read only memory (ROM) 11b, a random access memory (RAM) 11c, an external interface (I/F) unit 11d, a non-volatile storage medium such as a hard disk device (not illustrated), and various input/output ports, as illustrated in FIG. 4.

The CPU 11a performs predetermined information processing for realizing the function (for example, function of the posture changeable mechanism 60) of the temperature test apparatus 1 and comprehensive control for the temperature control device 120 or the NR system simulator 20. The ROM 11b stores an operating system (OS) for starting up the CPU 11a, other programs, control parameters, and the like. The RAM 11c stores execution codes, data, and the like of the OS and applications used in an operation of the CPU 11a. An external I/F unit 11d has an input interface function of receiving an input of a predetermined signal and an output interface function of outputting a predetermined signal.

The external I/F unit 11d is communicably connected to the NR system simulator 20 via the network 19. The external I/F unit 11d is connected to the temperature control device 120 and the posture changeable mechanism 60 via the network 19. The operation unit 12 and the display unit 13 are connected to the input/output port. The operation unit 12 is a functional unit for inputting various types of information such as commands. The display unit 13 is a functional unit of displaying various types of information such as an input screen for the various types of information and measurement results.

The above-described computer device functions as the control unit 11 when the CPU 11a executes a program stored in the ROM 11b with the RAM 11c as a work area. As illustrated in FIG. 4, the control unit 11 includes a call connection control unit 14a, a signal transmission and reception control unit 14b, a DUT posture control unit 14c, a temperature control unit 14d, a camera control unit 14e, and an posture determination unit 14f. The call connection control unit 14a, the signal transmission and reception control unit 14b, the DUT posture control unit 14c, the temperature control unit 14d, the camera control unit 14e, and the posture determination unit 14f are also realized by the CPU 11a executing a predetermined program stored in the ROM 11b in the work area of the RAM 11c.

The call connection control unit 14a drives the test antenna 6 to transmit and receive a control signal (radio signal) to and from the DUT 100, and thus perform control of establishing a call (in a state where transmission and reception of a radio signal is possible) between the NR system simulator 20 and the DUT 100.

The signal transmission and reception control unit 14b monitors a user operation in the operation unit 12. When the user performs a predetermined measurement start operation related to the measurement of the transmission characteristics and the reception characteristics of the DUT 100, the signal transmission and reception control unit transmits a signal transmission command to the NR system simulator 20 through the temperature control in the temperature control unit 14d and the call connection control in the call connection control unit 14a. Specifically, the signal transmission and reception control unit 14b controls the NR system simulator 20 to transmit a test signal via the test antenna 6, and also controls the NR system simulator 20 to transmit a signal reception command and to receive a measurement target signal via the test antenna 6.

The DUT posture control unit 14c controls the posture of the DUT 100 held by the posture changeable mechanism 60, during the measurement. In order to realize such control, for example, a DUT posture control table 17a is stored in advance in the RAM 11c or the ROM 11b. The DUT posture control table 17a stores the number of drive pulses (number of operation pulses) for determining the rotational drive of a stepping motor, as control data, when the stepping motor is adopted as the drive unit 61.

The DUT posture control unit 14c deploys the DUT posture control table 17a in the work area of the RAM 11c, and controls driving of the posture changeable mechanism 60 based on the DUT posture control table 17a so that the antenna 110 is sequentially directed in all three-dimensional directions, and the posture of the DUT 100 changes, as described above.

The temperature control unit 14d monitors the user operation in the operation unit 12, and transmits a temperature control command to the temperature control device 120 when the measurement start operation is performed by the user.

The camera control unit 14e performs control of activating the infrared camera device 140 and transmitting data of an image of the DUT 100, which is picked up by the infrared camera device 140 to the control unit 11 via the cable 18 (for example, a USB cable) and a USB port 11d1.

The posture determination unit 14f determines the suitability of the posture of the DUT 100 based on the image picked up by the infrared camera device 140.

NR System Simulator

Next, the NR system simulator 20 will be described.

Figure 5:
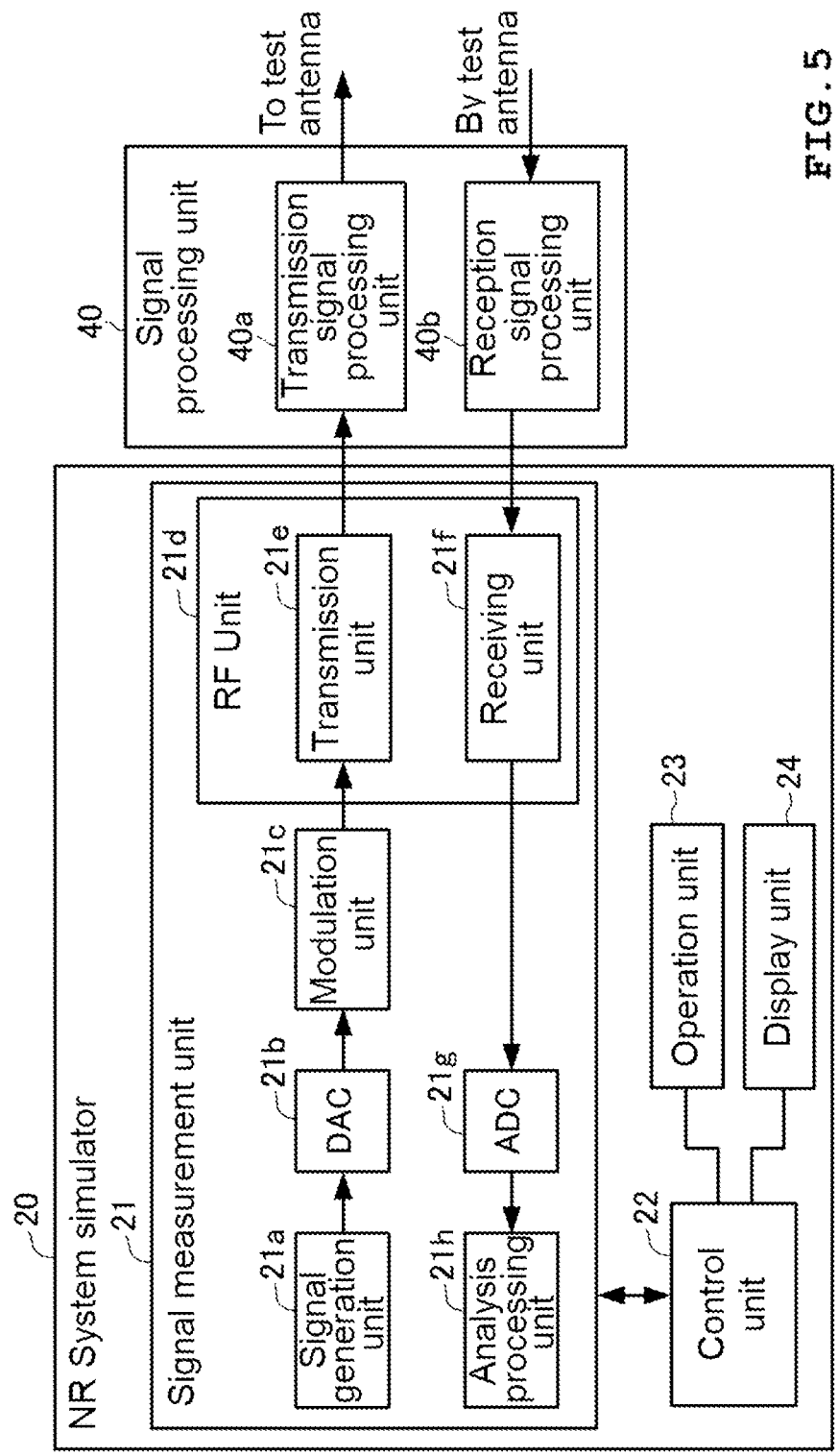
FIG. 5 is a block diagram illustrating a functional configuration of an NR system simulator in the temperature test apparatus according to the embodiment of the present invention.

As illustrated in FIG. 5, the NR system simulator 20 includes a signal measurement unit 21, a control unit 22, an operation unit 23, and a display unit 24. The signal measurement unit 21 includes a signal generation function unit and a signal analysis function unit. The signal generation function unit in the signal measurement unit 21 includes a signal generation unit 21a, a digital-to-analog converter (DAC) 21b, a modulation unit 21c, and a transmission unit 21e of an RF unit 21d. The signal analysis function unit in the signal measurement unit 21 includes a receiving unit 21f of the RF unit 21d, an analog-to-digital converter (ADC) 21g, and an analysis processing unit 21h.

In the signal generation function unit of the signal measurement unit 21, the signal generation unit 21a generates waveform data having a reference waveform, specifically, for example, an I component baseband signal and a Q component baseband signal being an orthogonal component signal of the I component baseband signal. The DAC 21*b* converts waveform data (I component baseband signal and Q component baseband signal) having a reference waveform output from the signal generation unit 21*a*, from a digital signal into an analog signal. The DAC outputs the resultant of the conversion to the modulation unit 21*c*.

The modulation unit 21*c* performs modulation processing of mixing a local signal with each of the I component baseband signal and the Q component baseband signal, combining both signals, and outputting a digital modulation signal. The RF unit 21*d* generates a test signal corresponding to the frequency of each communication standard, from the digital modulation signal output from the modulation unit 21*c*. The RF unit outputs the generated test signal to the DUT 100 by the transmission unit 21*e* through a transmission signal processing unit 40*a*, the test antenna 6, and the reflector 7.

In the signal analysis function unit of the signal measurement unit 21, the receiving unit 21*f* receives the measurement target signal transmitted from the DUT 100 that has received the test signal with the antenna 110, through the reception signal processing unit 40*b*. Then, the RF unit 21*d* converts the measurement target signal into a signal (IF signal) in an intermediate frequency band by mixing the measurement target signal with the local signal. The ADC 21*g* converts the measurement target signal converted into the IF signal by the receiving unit 21*f* of the RF unit 21*d*, from the analog signal into a digital signal. Then, the ADC outputs the digital signal into the analysis processing unit 21*h*.

The analysis processing unit 21*h* generates waveform data corresponding to each of the I component baseband signal and the Q component baseband signal by performing digital processing on the measurement target signal being the digital signal output by the ADC 21*g*. Then, the analysis processing unit performs processing of analyzing the I component baseband signal and the Q component baseband signal based on the waveform data. In the measurement of the transmission characteristics of the DUT 100, the analysis processing unit 21*h* can, for example, measure equivalent isotropically radiated power (EIRP), total radiated power (TRP), spurious radiation, modulation accuracy (EVM), transmission power, constellation, spectrum, and the like. In the measurement of the reception characteristics of the DUT 100, the analysis processing unit 21*h* can measure, for example, reception sensitivity, a bit error rate (BER), a packet error rate (PER), and the like. Here, EIRP indicates the radio signal intensity in the main beam direction of the antenna under test. Further, TRP indicates the total value of the electric power radiated into the space from the antenna under test.

The control unit 22 is configured by, for example, a computer device including a CPU, a RAM, a ROM, and various input/output interfaces, similar to the control unit 11 of the integrated control device 10 described above. The CPU performs predetermined information processing and control for realizing each function of the signal generation function unit, the signal analysis function unit, the operation unit 23, and the display unit 24.

The operation unit 23 and the display unit 24 are connected to the input/output interface of the computer device. The operation unit 23 is a functional unit for inputting various types of information such as commands. The display unit 24 is a functional unit of displaying various types of information such as an input screen for the various types of information and measurement results.

In the embodiment, the integrated control device 10 and the NR system simulator 20 are separate devices, but may be configured as one device. In this case, the control unit 11 of the integrated control device 10 and the control unit 22 of the NR system simulator 20 may be integrated and realized by one computer device.

Signal Processing Unit

Next, the signal processing unit 40 will be described.

As illustrated in FIG. 5, the signal processing unit 40 is provided between the NR system simulator 20 and the test antenna 6, and includes the transmission signal processing unit 40*a* and the reception signal processing unit 40*b*.

The transmission signal processing unit 40*a* is provided between the transmission unit 21*e* of the NR system simulator 20 and the test antenna 6, and is configured by an up-converter, an amplifier, a frequency filter, and the like. The transmission signal processing unit 40*a* performs processing of frequency conversion (up-conversion), amplification, and frequency selection on the test signal output to the test antenna 6.

The reception signal processing unit 40*b* is provided between the receiving unit 21*f* of the NR system simulator 20 and the test antenna 6, and is configured by a down-converter, an amplifier, a frequency filter, and the like. The reception signal processing unit 40*b* performs processing of frequency conversion (down-conversion), amplification, and frequency selection on the measurement target signal input from the test antenna 6.

Temperature Test Method

Next, the temperature test method will be described.

Figure 19:
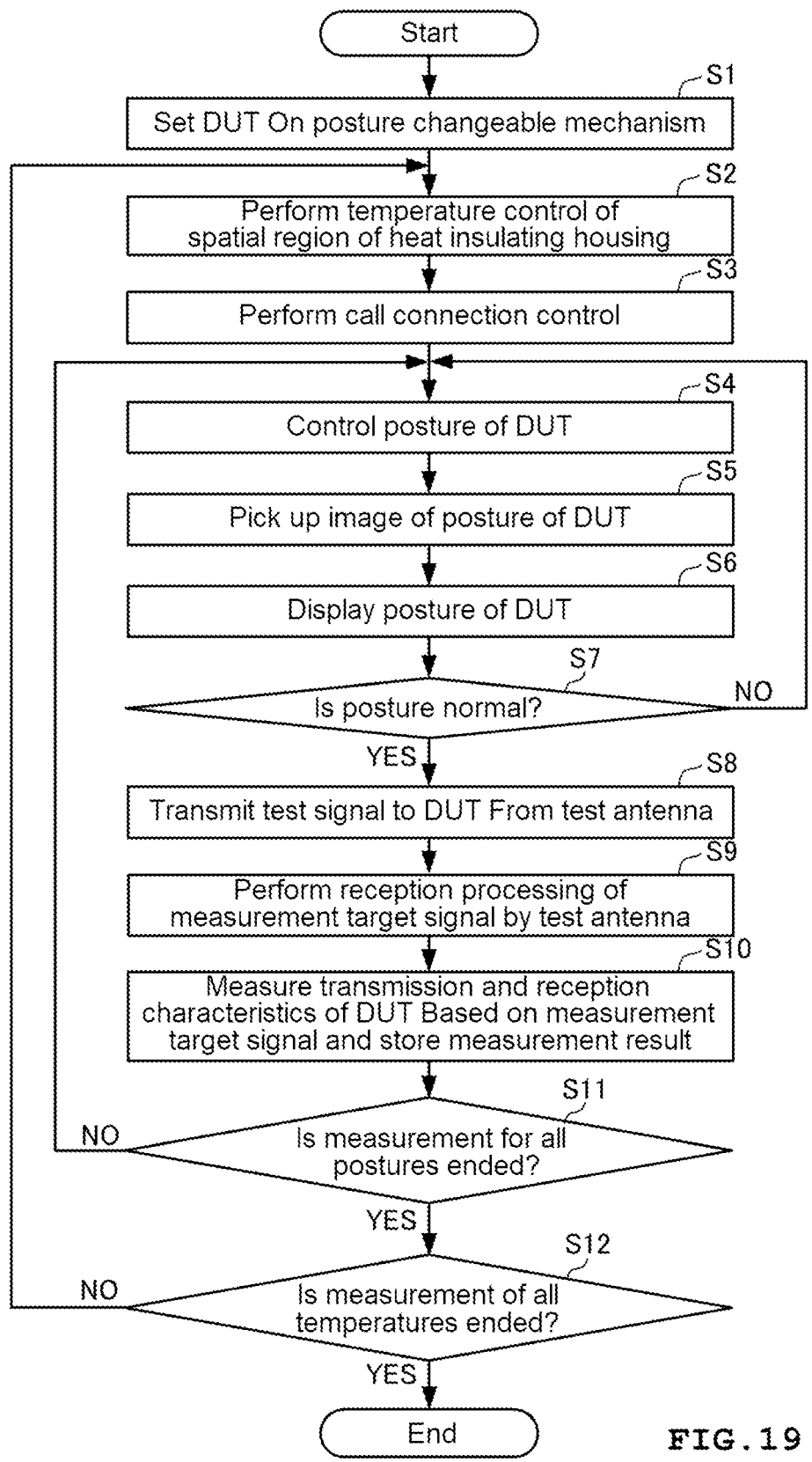
FIG. 19 is a flowchart illustrating an outline of a temperature test method performed using the temperature test apparatus according to the embodiment of the present invention.

FIG. 19 is a diagram illustrating a flowchart of the temperature test method for measuring the temperature dependency of the transmission characteristics and the reception characteristics of the DUT 100 by using the temperature test apparatus 1 according to the embodiment. As illustrated in FIG. 19, first, the user sets the DUT 100 as a test target on the DUT mounting portion 64 of the posture changeable mechanism 60 provided in the heat insulating housing 70 in the OTA chamber 50 (Step S1).

Then, the temperature control unit 14*d* in the control unit 11 of the integrated control device 10 transmits a temperature control command to the temperature control device 120. The temperature control device 120 performs temperature control based on the received temperature control command so that the temperature of the air in the spatial region 77 in the heat insulating housing 70 reaches the set temperature set by the user (Step S2). The set temperature may be input in advance by the user through the operation unit 12 of the integrated control device 10. Normally, a plurality of set temperatures are set. Measurement is performed while sequentially changing the set temperatures, and the temperature dependency of the transmission characteristics and the reception characteristics is examined.

Then, the call connection control unit 14*a* of the control unit 11 performs call connection control by using the test antenna 6 to transmit and receive a control signal (radio signal) to and from the DUT 100 (Step S3). Specifically, the NR system simulator 20 transmits a control signal (call connection request signal) having a predetermined frequency to the DUT 100 via the test antenna 6 by radio. The DUT 100 that has received the call connection request signal transmits, as a response, a control signal (call connection response signal) after setting the frequency for which the connection is requested. The NR system simulator 20 receives the call connection response signal and confirms that the response has been received normally. A series of the processing refers to the call connection control. With the call connection control, a state in which a radio signal having a predetermined frequency can be transmitted and received between the NR system simulator 20 and the DUT 100 via the test antenna 6 is established.

Processing in which the DUT 100 receives the radio signal transmitted from the NR system simulator 20 via the test antenna 6 and the reflector 7 is referred as downlink (DL) processing. On the contrary, processing in which the DUT 100 transmits the radio signal to the NR system simulator 20 via the reflector 7 and the test antenna 6 is referred to as uplink (UL) processing. The test antenna 6 is used to perform the processing of establishing a link (call) and the processing of downlink (DL) and uplink (UL) after the link is established, and also functions as the link antenna.

After establishing the call connection in Step S3, the DUT posture control unit 14c of the integrated control device 10 controls the posture of the DUT 100 set on the DUT mounting portion 64 in the quiet zone QZ to a predetermined posture by the posture changeable mechanism 60 (Step S4).

The infrared camera device 140 picks up an image of the DUT 100 disposed in the heat insulating housing 70 through the viewing window 160 (Step S5). At the time of image pickup, an infrared LED as a light source may irradiate the DUT 100 with infrared rays, and the infrared rays reflected from the DUT 100 may be detected by a light receiving sensor of the infrared camera device 140.

The display unit 13 in the integrated control device 10 displays an image (moving image or still image) of the DUT 100 picked up by the infrared camera device 140 (Step S6). Thus, the user can see the image of the DUT 100 displayed on the display unit 13 and check whether or not the posture of the DUT 100 is appropriate. Alternatively, the control unit 11 in the integrated control device 10 may be provided with the posture determination unit 14f that determines the suitability of the posture of the DUT 100. The posture determination unit 14f may apply a known image recognition technique to the image of the DUT 100 picked up by the infrared camera device 140, and compare the recognized posture of the DUT 100 to the normal posture acquired in advance. In this manner, the suitability of the posture of the DUT 100 may be determined.

When the posture of the DUT 100 is not appropriate (NO in Step S7), the process returns to Step S4. Thus, the posture control of the DUT 100 may be repeated again, or the test may be interrupted and restarted from the beginning or the middle. When the posture of the DUT 100 is appropriate (YES in Step S7), the process proceeds to Step S8.

In step S8, the signal transmission and reception control unit 14b of the integrated control device 10 transmits a signal transmission command to the NR system simulator 20. The NR system simulator 20 transmits a test signal to the DUT 100 via the test antenna 6 based on the received signal transmission command.

Specifically, the transmission of the test signal by the NR system simulator 20 is performed as follows. In the NR system simulator 20 (see FIG. 5), the signal generation unit 21a generates a signal for generating a test signal under the control of the control unit 22 that has received the signal transmission command. Then, the DAC 21b performs digital-to-analog conversion processing on the signal generated by the signal generation unit 21a. The modulation unit 21c performs modulation processing on the analog signal obtained by the digital-to-analog conversion. The RF unit 21d generates the test signal corresponding to the frequency of each communication standard, from the modulated signal.

The transmission unit 21e transmits the test signal (DL data) to the transmission signal processing unit 40a.

The transmission signal processing unit 40a performs signal processing such as frequency conversion (up-conversion), amplification, and frequency selection on the test signal, and transmits the signal after the processing to the test antenna 6. Such a signal is output to the DUT 100 via the reflector 7 by the test antenna 6.

The signal transmission and reception control unit 14b performs control during a period after the control of test signal transmission is started in Step S8 until the measurement of the transmission characteristics and the reception characteristics of the DUT 100 is ended, so that the test signal is transmitted at an appropriate timing.

The DUT 100 receives the test signal (DL data) transmitted via the test antenna 6 and the reflector 7 by the antenna 110 and transmits the measurement target signal being a response signal to the test signal.

Under the control of the signal transmission and reception control unit 14b, the reception processing of the measurement target signal transmitted from the DUT 100 is performed (Step S9). Specifically, the test antenna 6 receives the measurement target signal transmitted from the DUT 100 and outputs the received measurement target signal to the reception signal processing unit 40b. The reception signal processing unit 40b performs signal processing such as frequency conversion (down-conversion), amplification, and frequency selection on the measurement target signal, and outputs the signal to the NR system simulator 20.

The NR system simulator 20 performs measurement processing of measuring the measurement target signal subjected to frequency conversion by the reception signal processing unit 40b (Step S10).

Specifically, the receiving unit 21f of the RF unit 21d in the NR system simulator 20 receives an input of the measurement target signal subjected to signal processing by the reception signal processing unit 40b. Under the control of the control unit 22, the RF unit 21d converts the measurement target signal input to the receiving unit 21f into an IF signal having a lower frequency. Then, the ADC 21g converts the IF signal from an analog signal to a digital signal and outputs the digital signal to the analysis processing unit 21h, under the control of the control unit 22. The analysis processing unit 21h generates waveform data corresponding to each of the I component baseband signal and the Q component baseband signal. The analysis processing unit 21h analyzes the measurement target signal based on the above-described generated waveform data under the control of the control unit 22.

More specifically, in the NR system simulator 20, the analysis processing unit 21h measures the transmission characteristics and the reception characteristics of the DUT 100 based on the analysis result of the measurement target signal under the control of the control unit 22.

For example, for the transmission characteristics of the DUT 100, processing as follows is performed. Firstly, the NR system simulator 20 transmits a request frame for transmitting an uplink signal as a test signal under the control of the control unit 22. The DUT 100 transmits the uplink signal frame as the measurement target signal to the NR system simulator 20 in response to the request frame for transmitting the uplink signal. The analysis processing unit 21h performs processing of evaluating the transmission characteristics of the DUT 100 based on the uplink signal frame.

For the reception characteristics of the DUT 100, processing as follows is performed, for example. Under the control of the control unit 22, the analysis processing unit 21h calculates the number of transmissions of the measurement frame transmitted from the NR system simulator 20 as the test signal, and a ratio of the number of receptions of ACK and NACK transmitted from the DUT 100 as the measurement target signal with respect to the measurement frame, as an error rate (PER).

In Step S10, under the control of the control unit 22, the analysis processing unit 21h stores the results of measuring the transmission characteristics and the reception characteristics of the DUT 100 in a storage area (not illustrated) of the RAM or the like, in association with the temperature controlled in Step S2 and the posture controlled in Step S4.

Then, the control unit 11 of the integrated control device 10 determines whether or not the measurement of the transmission characteristics and the reception characteristics of the DUT 100 has been ended for all desired postures (Step S11). Here, when it is determined that the measurement has not been ended (NO in Step S11), the process returns to Step S4 and continues the processing.

When it is determined that the measurement has been completed for all the postures (YES in Step S11), the control unit 11 determines whether or not the measurement of the transmission characteristics and the reception characteristics of the DUT 100 has been ended for all temperatures set in advance by the user (Step S12).

When it is determined that the measurement has not been ended for all the temperatures (NO in Step S12), the control unit 11 returns to Step S2 and continues the processing. When it is determined that the measurement has been completed for all the temperatures (YES in Step S12), the control unit 11 ends the test.

Advantageous Effects

Next, the advantageous effects will be described by using the intake-system electromagnetic shield structure 200 as an example. The exhaust-system electromagnetic shield structure 300 also has the similar effects.

In the temperature test apparatus 1 according to the embodiment, the ventilation block 210 is provided to block the opening 502 formed in the outer surface plate 501 of the OTA chamber 50, and the plurality of through-holes 214 that penetrate from one end surface 215 to the other end surface 216 have a size of causing the gas having a temperature controlled by the temperature control device 120, and causing at least the test radio wave used in the OTA chamber 50 not to pass through. With this configuration, the opening 502 formed in the outer surface plate 501 of the OTA chamber 50 is electromagnetically shielded by the ventilation block 210. Thus, it is possible to emit a radio wave in the OTA chamber 50 to the outside through the opening 502, and it is not possible to enter an external unnecessary radio wave into the OTA chamber 50 through the opening 502.

The first space 225 and the second space 255 are formed in the front and rear of the ventilation block 210. With this configuration, resistance against the flow of the air increases by the ventilation block 210, but the first space 225 and the second space 255 facilitate the flow of the air, Thus, it is possible to suppress a decrease in the flow rate of the air as a whole.

In addition, the ventilation block 210 can be attached to the outer surface plate 501 of the OTA chamber 50, and the first cover 220 and the second cover 250 can also be attached to the outer surface plate 501 of the OTA chamber 50 or the ventilation block 210. Thus, it is not necessary to draw the pipe, and the assembly work is easily performed.

Further, in the temperature test apparatus 1 according to the embodiment, the first cover 220 includes the cover body 221 that forms the first space 225 and the attachment plate 230 that extends around the end portion of the cover body 221 in a brim shape. In the attachment plate 230, the groove 233 for heater wiring is formed on the surface 230a on an opposite side of a side of a surface on which the cover body 221 is located. The attachment plate 230 is attached to the outer surface plate 501 from the outer side so that the surface 230a faces the outer surface plate 501 of the OTA chamber 50. The heater 240 is accommodated in the groove 233 for the heater wiring of the attachment plate 230.

With this configuration, it is possible to effectively prevent the occurrence of dew condensation in the vicinity of the opening 502 in which the pipe 180 from the temperature control device 120 is connected to the OTA chamber 50. For example, even when the temperature in the heat insulating housing 70 is controlled to −10° C., it is possible to prevent the occurrence of dew condensation on the back surface of the OTA chamber 50. Thus, it is also possible to prevent the occurrence of rust in various mechanical sections provided on the back surface of the OTA chamber 50.

The present invention can be applied not only to an anechoic box but also to an anechoic chamber. In the above embodiment, the OTA chamber 50 is a chamber adopting the CATR method, but the present invention is not limited to this. The OTA chamber 50 may be a chamber adopting the direct far field method illustrated in FIG. 7A.

As described above, the present invention has the effects of the high electromagnetic shielding property of the anechoic box and high assemblability, and is useful for the temperature test apparatus and the temperature test method of a radio terminal in general.

DESCRIPTION OF REFERENCE NUMERALS AND SIGNS

1 Temperature test apparatus
2 Measurement device
5, 8 Link antenna
6 Test antenna
7 Reflector
7A Reflecting mirror
10 Integrated control device
11, 22 Control unit
11a CPU
11b ROM
11c RAM
11d External interface unit
11d1 USB port
12, 23 Operation unit
13, 24 Display unit
14a Call connection control unit
14b Signal transmission and reception control unit
14c DUT posture control unit
14d Temperature control unit
14e Camera control unit
14f Posture determination unit
17a DUT posture control table
18 Cable
19 Network
20 NR system simulator
21 Signal measurement unit
21a Signal generation unit
21b DAC
21c Modulation unit
21d RF unit 21e Transmission unit
21f Receiving unit
21g ADC
21h Analysis processing unit
30 Radio communication analyzer
40 Signal processing unit
40a Transmission signal processing unit
40b Reception signal processing unit
50 OTA chamber (anechoic box)
50a Inner surface
50b Outer surface
501 Outer surface plate
502, 503 Opening
51 Chamber body
511 Chamber back surface
51a Bottom surface
51b Side surface
51c Top surface
52a Door
52b Hinge
52c Handle
52d Access panel
54 Internal space
55 Radio wave absorber
57, 59 Holder
58 Reflector holder
60 Posture changeable mechanism
61 Drive unit
62 Turntable
63 Fulcrum
64 DUT mounting portion
70 Heat insulating housing
70a Outer surface
71 Top plate
72 Base plate
72a Through-hole
72b Rotating portion
72c Hole
73 Front plate
74 Back plate
75 Front-side plate
76 Rear-side plate
77 Spatial region
90 Rack structure body
90a Rack
100 DUT (device under test)
100A Radio terminal
110 Antenna (antenna under test)
120 Temperature control device
124 Temperature sensor
140 Infrared camera device
160 Viewing window
170 Intake port
171 Exhaust port
180 Pipe
181 Pipe fitting
200 Intake-system electromagnetic shield structure
210, 210A, 310 Ventilation block
211, 311 Block body
212, 312 Ventilation block attachment portion
214, 214A, 314 Ventilation hole
215, 215A End surface (one end surface)
216, 216A End surface (other end surface)
217 Curved portion
220, 320 First cover
221, 251, 321, 351 Cover body
223, 323 First communication hole
225, 325 First space
230, 330 Attachment plate
230a, 330a Surface
232, 332 Opening portion
233, 333 Groove for heater wiring
234, 334 Groove for thermocouple wiring
235, 335 Attachment hole
240, 340 Heater
250, 350 Second cover
252, 352 Cover attachment portion
253, 353 Second communication hole
255, 355 Second space
256, 356 End surface
300 Exhaust-system electromagnetic shield structure
380 Exhaust fan
260, 261, 262, 263, 264, 265, 360, 361, 362, 363 Heat insulating material
F Focal position
QZ Quiet zone
AT Antenna

What is claimed is:

1. A temperature test apparatus comprising:
an anechoic box;
a heat insulating housing that is accommodated in the anechoic box;
a temperature control device that controls a temperature in the heat insulating housing;
a ventilation block that is made of metal and provided to block an opening formed in an outer surface plate of the anechoic box, and in which a plurality of through-holes that penetrate from one end surface to the other end surface are formed;
a first cover that is provided on an outer side of the anechoic box to cover the one end surface of the ventilation block, and form a first space with the ventilation block, and includes a first communication hole for causing the first space to communicate with an outside of the anechoic box or an external pipe; and
a second cover that is provided on an inner side of the anechoic box to cover the other end surface of the ventilation block, and form a second space with the ventilation block, and includes a second communication hole for causing the second space to communicate with an inside of the heat insulating housing or an internal pipe,
wherein the through-hole of the ventilation block has a size that causes a gas having a temperature controlled by the temperature control device or a gas in the heat insulating housing to pass through and causes at least a test radio wave used in the anechoic box not to pass through.

2. The temperature test apparatus according to claim 1, wherein an end surface of the second cover, in which the second communication hole is formed, is attached to an outer surface of the heat insulating housing so that the second communication hole corresponds to an intake port or an exhaust port of the heat insulating housing.

3. The temperature test apparatus according to claim 1, wherein the through-hole of the ventilation block has a curved portion between the one end surface and the other end surface.

4. The temperature test apparatus according to claim 2, wherein the through-hole of the ventilation block has a curved portion between the one end surface and the other end surface.

5. The temperature test apparatus according to claim 1, wherein a pipe fitting for connecting a pipe for supplying the gas having a controlled temperature from the temperature control device is attached to the first communication hole of the first cover.

6. The temperature test apparatus according to claim 2, wherein a pipe fitting for connecting a pipe for supplying the gas having a controlled temperature from the temperature control device is attached to the first communication hole of the first cover.

7. The temperature test apparatus according to claim 3, wherein a pipe fitting for connecting a pipe for supplying the gas having a controlled temperature from the temperature control device is attached to the first communication hole of the first cover.

8. The temperature test apparatus according to claim 1, wherein an exhaust fan for forcibly discharging the gas in the heat insulating housing to the outside is attached to the first communication hole of the first cover.

9. The temperature test apparatus according to claim 2, wherein an exhaust fan for forcibly discharging the gas in the heat insulating housing to the outside is attached to the first communication hole of the first cover.

10. The temperature test apparatus according to claim 3, wherein an exhaust fan for forcibly discharging the gas in the heat insulating housing to the outside is attached to the first communication hole of the first cover.

11. The temperature test apparatus according to claim 8, wherein the second communication hole of the second cover has the same size as an exhaust port formed to be smaller than an intake port of the heat insulating housing.

12. The temperature test apparatus according to claim 9, wherein the second communication hole of the second cover has the same size as an exhaust port formed to be smaller than the intake port of the heat insulating housing.

13. The temperature test apparatus according to claim 10, wherein the second communication hole of the second cover has the same size as an exhaust port formed to be smaller than an intake port of the heat insulating housing.

14. The temperature test apparatus according to claim 1, wherein the first cover includes
a cover body that forms the first space, and
an attachment plate that extends around an end portion of the cover body in a brim shape,
the attachment plate has a groove for a heater wiring, the groove being formed on a surface on an opposite side of a surface of the attachment plate on a side on which the cover body is located, and is attached to the outer surface plate from the outer side so that the surface on the opposite side faces the outer surface plate of the anechoic box, and
the attachment plate accommodates a heater in the groove for the heater wiring.

15. The temperature test apparatus according to claim 2, wherein the first cover includes
a cover body that forms the first space, and
an attachment plate that extends around an end portion of the cover body in a brim shape,
the attachment plate has a groove for a heater wiring, the groove being formed on a surface on an opposite side of a surface of the attachment plate on a side on which the cover body is located, and is attached to the outer surface plate from the outer side so that the surface on the opposite side faces the outer surface plate of the anechoic box, and
the attachment plate accommodates a heater in the groove for the heater wiring.

16. The temperature test apparatus according to claim 3, wherein the first cover includes
a cover body that forms the first space, and
an attachment plate that extends around an end portion of the cover body in a brim shape,
the attachment plate has a groove for a heater wiring, the groove being formed on a surface on an opposite side of a surface of the attachment plate on a side on which the cover body is located, and is attached to the outer surface plate from the outer side so that the surface on the opposite side faces the outer surface plate of the anechoic box, and
the attachment plate accommodates a heater in the groove for the heater wiring.

17. The temperature test apparatus according to claim 1, further comprising:
a test antenna that is provided in the anechoic box, and transmits or receives a radio signal to or from a device under test;
a posture changeable mechanism that is provided in the anechoic box and controls a posture of the device under test; and
a measurement device that measures transmission characteristics or reception characteristics of the device under test by using the test antenna each time the posture of the device under test is changed by the posture changeable mechanism in a state where the temperature in the heat insulating housing is controlled by the temperature control device.

18. The temperature test apparatus according to claim 2, further comprising:
a test antenna that is provided in the anechoic box, and transmits or receives a radio signal to or from a device under test;
a posture changeable mechanism that is provided in the anechoic box and controls a posture of the device under test; and
a measurement device that measures transmission characteristics or reception characteristics of the device under test by using the test antenna each time the posture of the device under test is changed by the posture changeable mechanism in a state where the temperature in the heat insulating housing is controlled by the temperature control device.

19. The temperature test apparatus according to claim 3, further comprising:
a test antenna that is provided in the anechoic box, and transmits or receives a radio signal to or from a device under test;
a posture changeable mechanism that is provided in the anechoic box and controls a posture of the device under test; and
a measurement device that measures transmission characteristics or reception characteristics of the device under test by using the test antenna each time the posture of the device under test is changed by the posture changeable mechanism in a state where the temperature in the heat insulating housing is controlled by the temperature control device.

20. A temperature test method using a temperature test apparatus including an anechoic box, a heat insulating housing that is accommodated in the anechoic box, a temperature control device that controls a temperature in the heat insulating housing, a ventilation block that is made of metal and provided to block an opening formed in an outer surface plate of the anechoic box, and in which a plurality of through-holes that penetrate from one end surface to the other end surface are formed, a first cover that is provided on an outer side of the anechoic box to cover the one end surface of the ventilation block, and form a first space with the ventilation block, and includes a first communication hole for causing the first space to communicate with an outside of the anechoic box or an external pipe, and a second cover that is provided on an inner side of the anechoic box to cover the other end surface of the ventilation block, and form a second space with the ventilation block, and includes a second communication hole for causing the second space to communicate with an inside of the heat insulating housing or an internal pipe, in which the through-hole of the ventilation block has a size that causes a gas having a temperature controlled by the temperature control device or a gas in the heat insulating housing to pass through and causes at least a test radio wave used in the anechoic box not to pass through, the method comprising:

a temperature control step of controlling the temperature in the heat insulating housing to a plurality of predetermined temperatures;

a posture changeable step of sequentially changing a posture of a device under test disposed in the heat insulating housing; and a measurement step of measuring transmission characteristics or reception characteristics of the device under test each time the posture of the device under test is changed by the posture changeable step in a state where the temperature in the heat insulating housing is controlled by the temperature control step.

* * * * *